(12) United States Patent
Fukushima et al.

(10) Patent No.: US 10,062,594 B2
(45) Date of Patent: Aug. 28, 2018

(54) END EFFECTOR DEVICE

(71) Applicant: KAWASAKI JUKOGYO KABUSHIKI KAISHA, Kobe-shi, Hyogo (JP)

(72) Inventors: Takayuki Fukushima, Takarazuka (JP); Ryosuke Kanamaru, Kakogawa (JP); Daiki Miyagawa, Akashi (JP)

(73) Assignee: KAWASAKI JUKOGYO KABUSHIKI KAISHA, Kobe-shi (JP)

( * ) Notice: Subject to any disclaimer, the term of this patent is extended or adjusted under 35 U.S.C. 154(b) by 0 days.

(21) Appl. No.: 15/108,487

(22) PCT Filed: Dec. 22, 2014

(86) PCT No.: PCT/JP2014/006402
§ 371 (c)(1),
(2) Date: Jun. 27, 2016

(87) PCT Pub. No.: WO2015/098093
PCT Pub. Date: Jul. 2, 2015

(65) Prior Publication Data
US 2016/0322246 A1    Nov. 3, 2016

(30) Foreign Application Priority Data

Dec. 26, 2013 (JP) .................................. 2013-268302

(51) Int. Cl.
*H01L 21/67* (2006.01)
*H01L 21/677* (2006.01)
(Continued)

(52) U.S. Cl.
CPC .. *H01L 21/67766* (2013.01); *H01L 21/67259* (2013.01); *H01L 21/67265* (2013.01);
(Continued)

(58) Field of Classification Search
CPC ......... H01L 21/67754; H01L 21/67766; H01L 21/67781; H01L 21/67259;
(Continued)

(56) References Cited

U.S. PATENT DOCUMENTS 5,273,244 A * 12/1993 Ono .................. H01L 21/67766
211/1.57
5,423,503 A * 6/1995 Tanaka .............. H01L 21/67766
211/1.57
(Continued)

FOREIGN PATENT DOCUMENTS

JP    H05-235147 A    9/1993
JP    H11-163096 A    6/1999
(Continued)

OTHER PUBLICATIONS

Mar. 24, 2015 International Search Report issued in International Patent Application No. PCT/JP2014/006402.
(Continued)

*Primary Examiner* — Dean J Kramer
(74) *Attorney, Agent, or Firm* — Oliff PLC

(57) ABSTRACT

An end effector device is provided with a hand; a plurality of holding portions that are provided to the hand, and that hold a plurality of semiconductor wafers such that the plurality of semiconductor wafers are arranged at intervals in the vertical direction in a parallel attitude; a single detector that is arranged outside the plurality of semiconductor wafers viewed from the vertical direction, and that is configured to be able to detect the presence of each one of the semiconductor wafers, opposing a peripheral portion of the semiconductor wafer; and a detector moving mechanism that moves the single detector relative to the plurality of
(Continued)

semiconductor wafers in the vertical direction such that the single detector opposes the peripheral portion of every semiconductor wafer.

10 Claims, 15 Drawing Sheets

(51) Int. Cl.
    *H01L 21/687* (2006.01)
    *B25J 19/02* (2006.01)
(52) U.S. Cl.
    CPC .. *H01L 21/67781* (2013.01); *H01L 21/68707* (2013.01); *H01L 21/68771* (2013.01); *B25J 19/021* (2013.01)
(58) Field of Classification Search
    CPC ......... H01L 21/67265; H01L 21/68707; H01L 21/68771; B25J 11/0095; B25J 19/021; B25J 19/022; B25J 19/025
    USPC .............. 294/213, 103.1; 414/416.02, 749.5; 198/468.3
    See application file for complete search history.

(56) References Cited

U.S. PATENT DOCUMENTS

| | | | | |
|---|---|---|---|---|
| 6,188,323 | B1 * | 2/2001 | Rosenquist | H01L 21/67265 340/686.5 |
| 7,260,448 | B2 * | 8/2007 | Goto | H01L 21/67259 414/937 |
| 7,596,456 | B2 * | 9/2009 | Mollenkopf | H01L 21/67271 702/33 |
| 9,343,341 | B2 * | 5/2016 | Hashimoto | H01L 21/67742 |
| 9,343,344 | B2 * | 5/2016 | Hashimoto | H01L 21/67742 |
| 2001/0048867 | A1 * | 12/2001 | Lebar | C23C 16/4583 414/217 |
| 2004/0013503 | A1 | 1/2004 | Sandhu et al. | |
| 2005/0123383 | A1 | 6/2005 | Goto et al. | |
| 2010/0280653 | A1 | 11/2010 | Aburatani | |

FOREIGN PATENT DOCUMENTS

| | | |
|---|---|---|
| JP | 2925329 B2 | 7/1999 |
| JP | 2000-91255 A | 3/2000 |
| JP | 2001-118909 A | 4/2001 |
| JP | 2001-291759 A | 10/2001 |
| JP | 2002-076097 A | 3/2002 |
| JP | 2003-309166 A | 10/2003 |
| JP | 2005-340729 A | 12/2005 |
| JP | 2006-313865 A | 11/2006 |
| JP | 2010-179419 A | 8/2010 |

OTHER PUBLICATIONS

Jul. 7, 2016 International Preliminary Report on Patentability issued in International Patent Application No. PCT/JP2014/006402.

Jul. 5, 2017 Search Report issued in European Patent Application No. 14874691.0.

\* cited by examiner (a)

(b)

END EFFECTOR DEVICE

TECHNICAL FIELD

The present invention relates to an end effector device, and particularly relates to an end effector device capable of detecting the presence of a plurality of substrates, which are arranged at vertical intervals, for each one of the substrates.

BACKGROUND ART

For example, semiconductor manufacturing process includes a step of carrying-out thin disk-shaped semiconductor wafers in the horizontal direction from a hoop where the semiconductor wafers are stored and then conveying said semiconductor wafers to a treatment device for performing a predetermined treatment. A hand portion provided to a distal end portion of a robot arm is used for conveying the semiconductor wafer.

When carrying-out the semiconductor wafers from this hoop using the hand portion, there is a risk that the semiconductor wafers could fail to be carried-out. This results in an unsuccessful treatment of a predetermined number of semiconductor wafers. Accordingly, a configuration is presented where a sensor for detecting the presence of semiconductor wafers is provided to the hand portion so as to accurately carry-out the semiconductor wafers (refer to PTL 1).

CITATION LIST

Patent Literature

[PTL 1] Japanese Patent Application Laid-Open No. 2002-76097

SUMMARY OF INVENTION

Technical Problem

Generally, a plurality of semiconductor wafers are stored in a hoop such that they are vertically separated from each other, and the plurality of semiconductor wafers are carried-out at a time and conveyed to a treatment device in order to shorten the time for semiconductor manufacturing process. Accordingly, a corresponding number of hand portions to the number of semiconductor wafers need to be provided. Consequently, a corresponding number of sensors to the number of semiconductor wafers also need to be provided, resulting in cost increase by the number of the plurality of sensors.

An object of the present invention is to provide an end effector device capable of detecting the presence of a plurality of semiconductor wafers, which are arranged in such a way that they are vertically separated from each other, by one sensor.

Solution to Problem

An end effector device according to an aspect of the present invention is provided with a hand; a plurality of holding portions that are provided to the hand, and that hold a plurality of substrates such that the plurality of substrates are arranged at intervals in a first direction that is substantially parallel to one plane and substantially orthogonal to the one plane; a single detector that is arranged outside the plurality of substrates viewed from the first direction, and that is configured to be able to detect a presence of each one of the substrates, opposing a peripheral portion of the substrate; and a detector moving mechanism that moves the single detector relative to the plurality of substrates in the first direction such that the single detector opposes the peripheral portion of every substrate.

In accordance with this configuration, the plurality of substrates are arranged at relative intervals in the first direction on the hand. The single detector moves in the first direction by means of the detector moving mechanism, enabling the presence of every substrate to be detected by the single detector. Namely, as a corresponding number of detectors to the number of substrates do not need to be provided, the configuration of detecting the presence of substrates is simplified, resulting in cost reduction of the end effector device as a whole.

Further, each of the holding portions may include a plurality of receiving portions each receiving a peripheral portion of the corresponding substrate with the substrate substantially parallel to the one plane, the receiving portions being arranged in the first direction corresponding to the number of the substrates; and a pitch conversion mechanism configured to move each receiving portion in the first direction so as to convert the interval between adjacent substrates, and the detector moving mechanism may move the detector in the first direction oppositely to a direction that the pitch conversion mechanism converts the interval between adjacent substrates.

In accordance with this configuration, for example, when the plurality of substrates move by means of the pitch conversion mechanism in the first direction such that an interval between adjacent substrates is shortened, the detector moves by means of the detector moving mechanism in a direction that the interval of the substrates is expanded so as to detect the presence of the plurality of substrates. In other words, when the substrates are lowered such that the interval of the substrates is shortened, the detector is elevated in contrast so as to detect the presence of every substrate. Thereby, a maximum moving distance of the detector required to detect the presence of every substrate is less than an interval between the uppermost substrate and the lowermost substrate in a state that the interval between adjacent substrates is set to the longest. Consequently, a thinner and smaller end effector device can be achieved.

Further, the pitch conversion mechanism and the detector moving mechanism may be linked mutually and driven by a common drive source.

In accordance with this configuration, by driving the pitch conversion mechanism and the detector moving mechanism by the common drive source, a configuration for driving the pitch conversion mechanism and the detector moving mechanism is simplified. Also, the pitch conversion mechanism and the detector moving mechanism can be readily synchronized and driven.

Further, each of the holding portions may include a plurality of receiving portions that receive a peripheral portion of each substrate in substantially parallel to the one plane, and that are arranged in the first direction corresponding to number of the substrates; and a pitch conversion mechanism configured to move each receiving portion in the first direction so as to convert an interval between adjacent substrates, the pitch conversion mechanism and the detector moving mechanism may be driven by separate drive sources, and the detector moving mechanism may move the detector in the first direction so as to detect presence of the plurality of substrates in a state that the interval between adjacent substrates is set to a minimum interval by the pitch conversion mechanism.

In accordance with this configuration, a moving distance of the detector in the first direction can be set short by moving the detector in the first direction so as to detect the presence of the plurality of substrates in a state that the interval between adjacent substrates is set to a minimum interval. Thereby, a thinner and smaller end effector device can be achieved Further, the pitch conversion mechanism may include a plurality of linearly moving bodies each moving in the first direction and comprising a corresponding number of receiving portions to the number of the substrates; and a slider connected to the drive source and linearly moving in a second direction that is substantially parallel to the one plane so as to move the plurality of linearly moving bodies in the first direction, and the detector moving mechanism may be driven interlockingly with a linear movement of the slider.

Further, the hand may include a main body portion formed so as to extend in the second direction and having a distal end portion and a proximal end portion, and a movable portion connected on a proximal end side of the main body portion so as to advance and retreat in the second direction, the main body portion and the movable portion may form their respective storing spaces therein, the pitch conversion mechanism may include a drive portion arranged between the plurality of linearly moving bodies and the slider, the drive portion may be arranged in the storing spaces of the main body portion and the movable portion, and the plurality of linearly moving bodies may be provided outside the main body portion and the movable portion.

As the drive portion generally includes sliding or rotating members, particles such as dust could be generated upon driving. In accordance with this configuration, the drive portion is arranged in the storing spaces inside the main body portion and the movable portion, and therefore the particles do not go out of the main body portion and the movable portion and do not adhere to substrates received by the receiving portions of the linearly moving bodies which are positioned outside the main body portion and the movable portion. Thereby, substrates can be prevented from being contaminated by particles caused by the drive portion.

Further, the plurality of holding portions may include a first holding portion provided to a distal end portion of the main body portion and a second holding portion provided to the movable portion, and the end effector device may be configured such that the peripheral portions of the plurality of substrates are held by the plurality of receiving portions of the first holding portion and the second holding portion when the movable portion advances, and the peripheral portions of the plurality of substrates are released from the receiving portions of the second holding portion when the movable portion retreats.

In accordance with this configuration, the substrates are held by the receiving portions of the first holding portion provided to the distal end portion of the main body portion of the hand and the second holding portion provided to the movable portion of the hand, and therefore the substrates are held stably. Also, the holding state of the substrates can be readily released when the movable portion is retreated, and therefore the substrates can be readily taken out from the end effector device.

Advantageous Effect of Invention

In the present invention, the single detector moves by means of the detector moving mechanism in the first direction, enabling the presence of every substrate to be detected by the single detector. Namely, a corresponding number of detectors to the number of substrates do not need to be provided, and therefore a configuration of detecting the presence of substrates is simplified, resulting in cost reduction of the end effector device as a whole.

DESCRIPTION OF EMBODIMENTS

Figure 1:
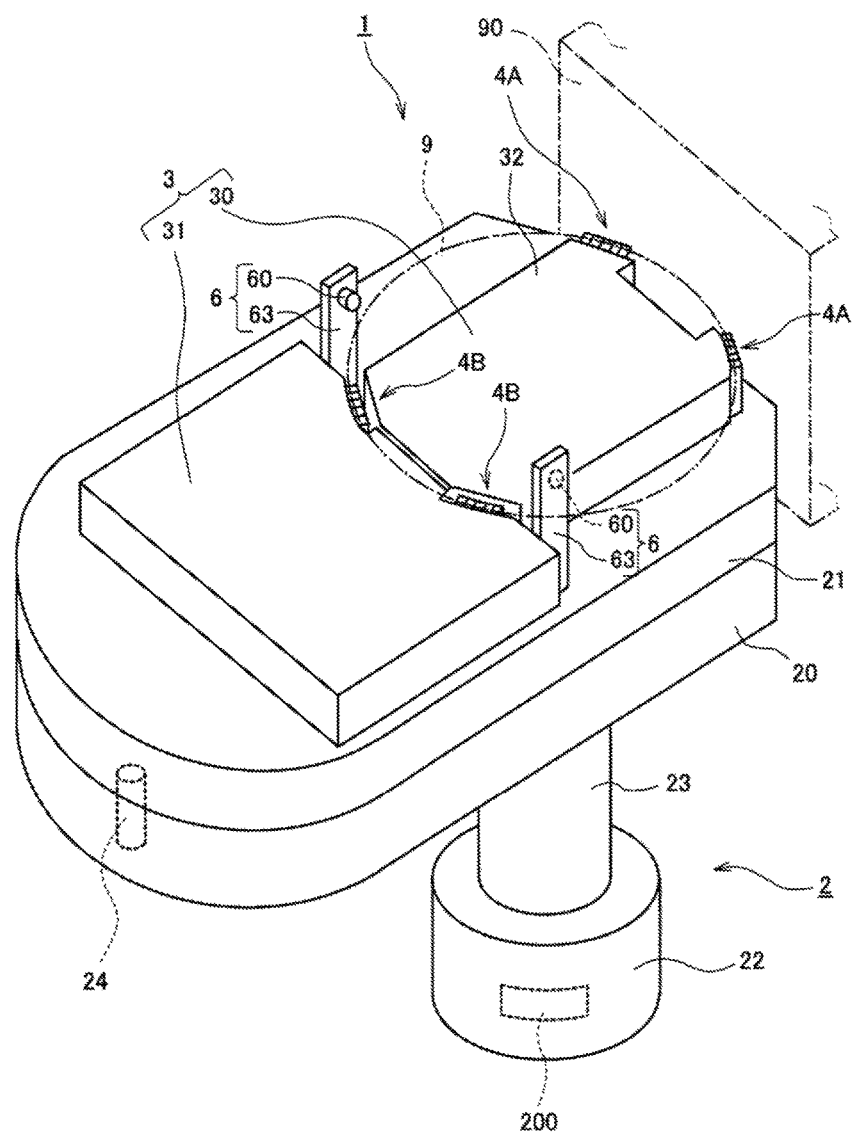
FIG. 1 is an overall perspective view of a substrate conveyance robot in which an end effector device according to an embodiment of the present invention is used.

Hereunder, an embodiment of the present invention will be described in detail using the drawings. Note that the same reference numerals are assigned to the same or corresponding components throughout all the figures and overlapping descriptions will be omitted. Also, note that the vertical direction refers to the direction along the vertical line in the description below.

<Overall Configuration of Substrate Conveyance Robot>

The present invention relates to an end effector device mounted to a distal end portion of an arm of a substrate conveyance robot. First, the substrate conveyance robot will be described as a whole. Incidentally, though a disk-shaped semiconductor wafer is exemplified as a substrate to be conveyed by the substrate conveyance robot, such substrate is not limited to said semiconductor wafer. For example, a substrate may be a glass substrate for a thin liquid crystal display and an organic EL display to be treated in a semiconductor process. Also, the semiconductor wafer is a substrate material for a semiconductor device and includes a silicon wafer, a silicon carbide wafer, a sapphire wafer, and the like.

In this embodiment, the substrate conveyance robot is a robot which conveys a plurality of semiconductor wafers from a hoop to another place for performing a predetermined treatment and which is provided with a pitch conversion mechanism for converting a vertical pitch between adjacent semiconductor wafers upon this conveyance, as described below. In the description below, the pitch conversion mechanism is configured to perform an operation of extending the vertical pitch between adjacent semiconductor wafers when conveying a plurality of semiconductor wafers from the hoop to another place.

FIG. 1 is an overall perspective view of a substrate conveyance robot 2. The substrate conveyance robot 2 is a robot arranged in a semiconductor treatment equipment so as to convey a plurality of semiconductor wafers, such as a so-called horizontal articulated type robot, for example. The substrate conveyance robot 2 is configured by a support base 22 fixed to a floor face, for example, an arm support shaft 23 which is elevatably and turnably provided on the support base 22, and an arm 20 one end portion of which is pivotably mounted to an upper end portion of the arm support shaft 23 and which is extending in the horizontal direction. One end portion of a base 21 extending in the horizontal direction so as to overlap the arm 20 is provided on the other end portion of the arm 20 via a shaft body 24, which is vertically extending, so as to rotate in a horizontal plane. Operations of the substrate conveyance robot 2 and an end effector device 1, which will be described below, are controlled by a control device 200 arranged in the support base 22. Note that the control device 200 may be provided in a place other than the support base 22.

A hand 3 extending in the same direction as the base 21 is provided on the base 21. A hoop 90 where a plurality of semiconductor wafers 9 are stored at vertical intervals is provided so as to face a distal end portion of the hand 3. For convenience of explanation, it is provided that five semiconductor wafers 9 are stored at equal intervals in the height direction in the hoop 90 in this embodiment. The arm 20 rotates in the horizontal plane about the arm support shaft 23 and the base 21 rotates about the shaft body 24, thereby enabling the hand 3 to approach and be separated from the hoop 90. In the description below, a direction that the hand 3 is headed toward the hoop 90 is called forward direction, and a direction that the hand 3 is separated from the hoop 90 is called rearward direction. Also, a direction orthogonal to the forward and rearward direction in the horizontal place is called lateral direction. Further, movements of the hand 3 in the forward direction and the rearward direction are called advance and retreat, respectively.

In addition, the mechanism for driving the hand 3 is not limited to the configuration provided with the arm 20, the base 21, the support base 22, the arm support shaft 23, and the shaft body 24 as mentioned above, and various configurations such as orthogonal coordinate type, cylindrical coordinate type, articulated type, parallel link type, and the like, for example, may be employed.

<Overall Configuration of Hand 3>

The hand 3 is provided with one main body portion 30 fixed to the base 21 and one movable portion 31 provided such that it is positioned on the rear end side of the main body portion 30 so as to advance and retreat on the base 21. Both the main body portion 30 and the movable portion 31 are formed hollowly, storing spaces defined by this hollow sections are formed thereinside. A horizontal facing surface 32 is formed in a region for holding the semiconductor wafer 9 on the upper surface of the main body portion 30, and a plurality of (four in FIG. 1) holding portions each of which holds the corresponding peripheral portions of the semiconductor wafers 9 are provided around the facing surface 32.

The holding portions are configured by two first holding portions 4A provided to be separated from each other in the lateral direction and two second holding portions 4B provided to each distal end portion of the movable portion 31. Namely, mutually different parts of the peripheral portion of each semiconductor wafer 9 are held by a plurality of first holding portions 4A and second holding portions 4B. A main portion of the end effector device 1 mounted to a distal end portion of the substrate conveyance robot 2 is configured by the hand 3 and the both holding portions 4A, 4B. The first holding portions 4A do not move forward and rearward since they are provided to the main body portion 30. The second holding portions 4B move forward and rearward together with the movable portion 31 since they are provided to the movable portion 31. The semiconductor wafers 9 are held by the first holding portions 4A and the second holding portions 4B in a state that the movable portion 31 advances. The second holding portions 4B are separated from the semiconductor wafers 9 and the holding is released in a state that the movable portion 31 retreats.

Figure 2:
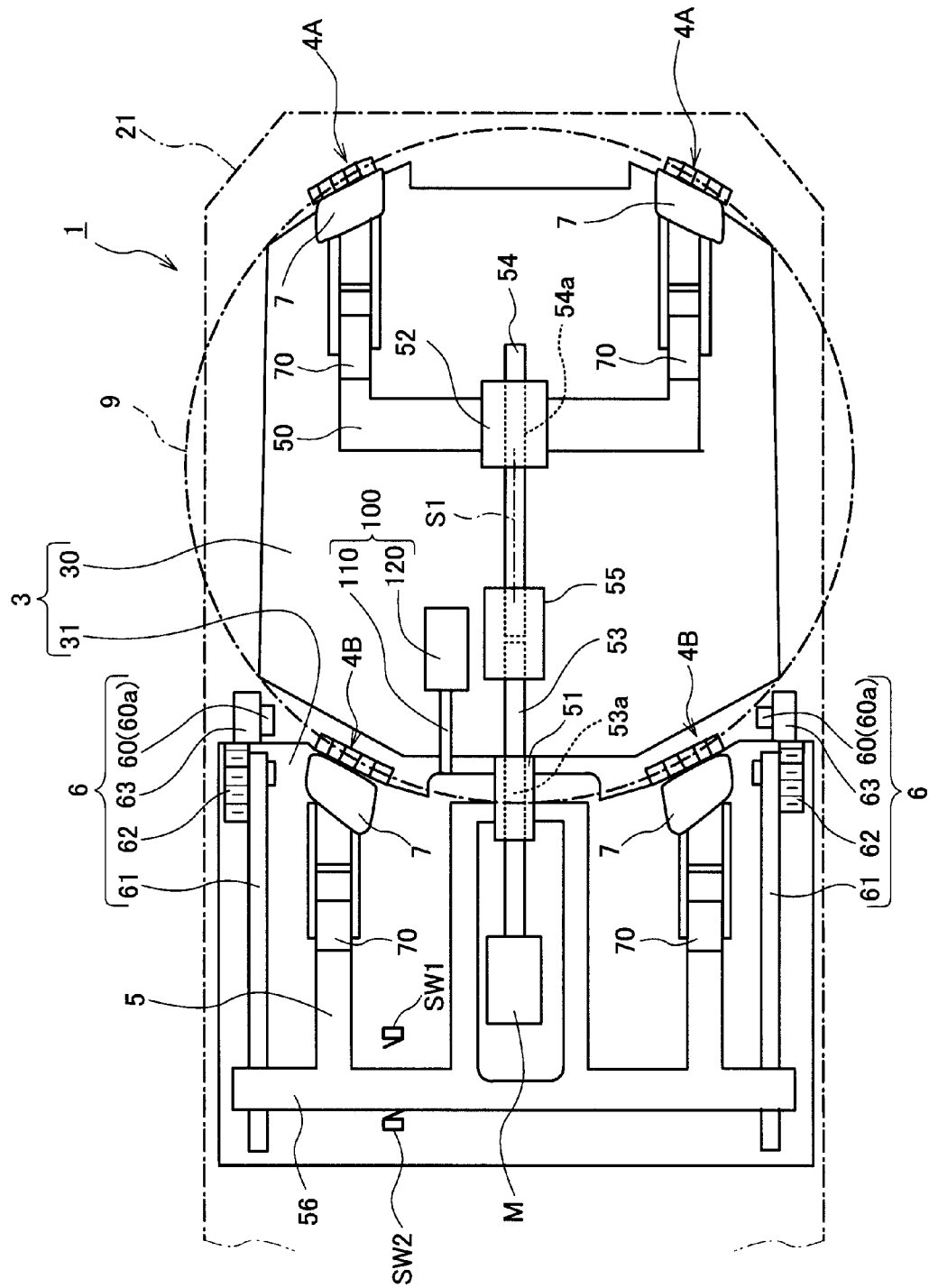
FIG. 2 is a plan view illustrating an internal configuration of a main body portion and a movable portion.
Figure 3:
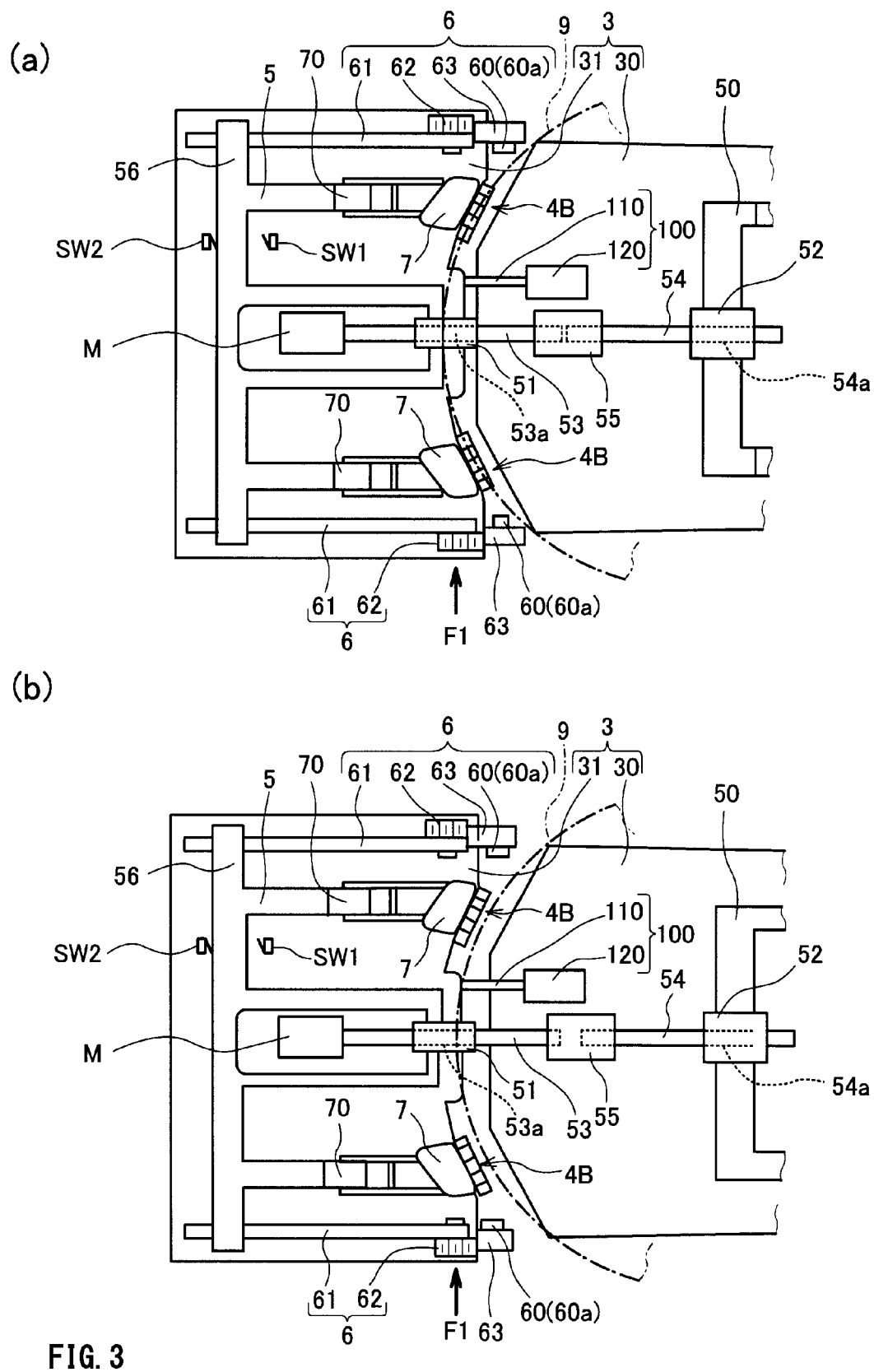
FIGS. 3 (a), (b) are plan views illustrating relative positions between the main body portion and the movable portion.
Figure 4:
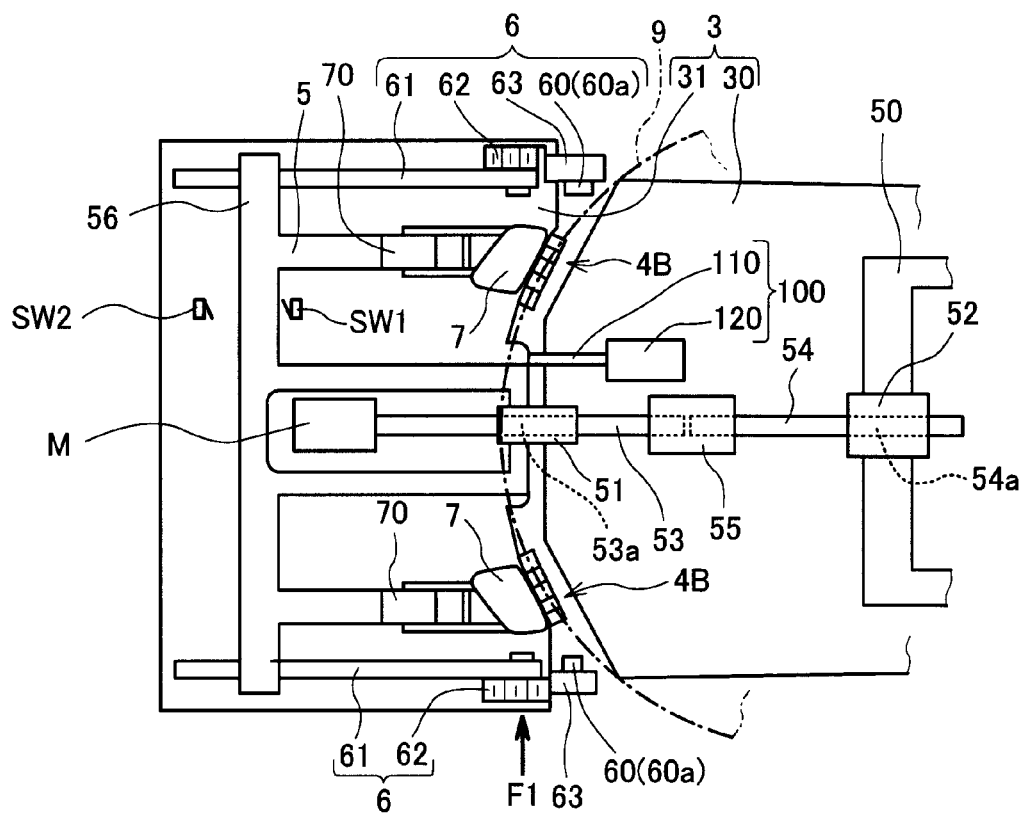
FIG. 4 is a plan view illustrating an operation after the movable portion has finished advancing relative to the main body portion.

FIG. 2 is a plan view illustrating an internal configuration of the main body portion 30 and the movable portion 31, and FIGS. 3 (a), (b) are plan views illustrating relative positions between the main body portion 30 and the movable portion 31. In addition, FIG. 4 is a plan view illustrating an operation after the movable portion 31 has finished advancing relative to the main body portion 30. Drive mechanism sections in the main body portion 30 and the movable portion 31 are arranged in the aforementioned storing spaces in order to prevent dust such as particles, which are generated when said drive mechanism sections are driven, from scattering to the outside. In the description below, it is provided that "in the main body portion" and "in the movable portion" refer to the inside of the storing space of the main body portion and the inside of the storing space of the movable portion, respectively.

A cylinder device 100 for moving the movable portion 31 forward and rearward is provided in the main body portion 30. This cylinder device 100 is an air cylinder configured by providing a piston 110 telescopically into a housing 120. A distal end portion of the piston 110 is connected to the movable portion 31. As illustrated in FIG. 3(a), when the piston 110 is retracted in the housing 120, the movable portion 31 advances and the semiconductor wafer 9 is held by the first holding portions 4A and the second holding portions 4B, as mentioned above. As illustrated in FIG. 3(b), when the piston 110 extends from the housing 120, the movable portion 31 retreats and the holding of the semiconductor wafer 9 is released.

Each of the first holding portion 4A and the second holding portion 4B is configured by five linearly moving bodies ranging along the peripheral portion of the semiconductor wafer 9, the number of which corresponds to the number of semiconductor wafers 9 so as to hold the peripheral portions of the respective semiconductor wafers 9. The linearly moving bodies are elevated up to different height positions from each other so as to convert a pitch of the semiconductor wafers 9, as mentioned below. Namely, in a state that the movable portion 31 has finished advancing and the semiconductor wafers 9 can be held, the linearly moving bodies of the first holding portions 4A and the second holding portions 4B are elevated up to different height positions from each other.

In the main body portion 30, a pitch conversion mechanism 7 connected to each of the first holding portions 4A and the second holding portions 4B, and a first slider 70 which slides forward and rearward so as to drive the pitch conversion mechanism 7 are provided. In the movable portion 31, a main slide body 5 connected to the first sliders 70 corresponding to the second holding portions 4B is provided so as to move forward and rearward. In the body portion 30, a sub slide body 50 connected to the first sliders 70 corresponding to the first holding portions 4A is provided so as to move forward and rearward. Both the main slide body 5 and the sub slide body 50 are each formed of a rigid body such as a metal plate. A first screw cylinder 51 formed with an internal thread is provided to a fore end portion of the main slide body 5. A ball screw portion 53a formed in a middle portion of a first shaft 53, which extends forward and rearward, is threaded into this first screw cylinder 51. A rear end portion of the first shaft 53 is connected to the motor M. The first shaft 53 is rotated and the first screw cylinder 51 and the main slide body 5 move forward and rearward resulting from the rotation of the motor M.

A second screw cylinder 52 formed with an internal thread is provided to a rear end portion of the sub slide body 50. A ball screw portion 54a formed in a distal end portion of a second shaft 54, which extends forward and rearward, is threaded into this second screw cylinder 52. Both the first shaft 53 and the second shaft 54 are provided so as to rotate about a center axis S1 extending forward and rearward.

In the main body portion 30, a ball spline mechanism 55 is provided between the first screw cylinder 51 and the second screw cylinder 52. This ball spline mechanism 55 comprises an outer cylinder provided so as to rotate about the center axis S1, and a distal end portion of the first shaft 53 and a rear end portion of the second shaft 54 are fitted in said outer cylinder at an interval from each other in the forward and rearward direction. Namely, the distal end portion of the first shaft 53 and the rear end portion of the second shaft 54 act as a publicly known spline shaft, and the rotation of the first shaft 53 is transmitted to the second shaft 54 even when the first shaft 53 approaches or is separated from the second shaft 54.

On the outside of the positions where the semiconductor wafers 9 are held viewed from the forward and rearward direction, two detector moving mechanisms 6 are provided to the respective sides of the main slide body 5. A drive piece 56 extending laterally is provided in a rear end portion of the main slide body 5. In the movable portion 31, an advance detection switch SW1 for detecting the main slide body 5 having finished advancing and a retreat detection switch SW2 for detecting the main slide body 5 having finished retreating are provided on a forward and rearward transfer passage of the drive piece 56. Note that positions of the both switches SW1 and SW2 are not limited to the positions in FIG. 2 to FIG. 4.

Each detector moving mechanism 6 is provided with an endless belt 61 connected to the corresponding lateral end portion of the drive piece 56 so as to rotate interlockingly with the main slide body 5, a pinion gear 62 provided to a fore end portion of this endless belt 61 so as to rotate interlockingly with the rotation of the endless belt 61, an elevating/lowering pole engaged with this pinion gear 62 so as to be elevated/lowered relative to the semiconductor wafers 9, and a sensor 60 mounted to the inside of an upper end portion of this elevating/lowering pole 63. Among components of each detector moving mechanism 6, the elevating/lowering pole 63 and the sensor 60 are provided to the outside of the movable portion 31 and the other components are provided in the movable portion 31. When the main slide body 5 slides forward and rearward, the elevating/lowering pole 63 and the sensor 60 are elevated and lowered via the endless belt 61 and the pinion gear 62.

The pair of sensors 60 are provided such that the peripheral portions of the semiconductor wafers 9 are positioned between the sensors 60, and the both sensors 60 configure a sensor pair 60a. Any one of the pair of sensors 60 is a light emitting element, and the other is a light receiving element. When light from the light emitting element is blocked by the peripheral portion of the semiconductor wafer 9 and does not reach the light receiving element, it is detected that the peripheral portion of the semiconductor wafer 9 is positioned between the pair of sensors 60. Namely, "detector" of the present invention is configured by the sensor pair 60a, and the presence of the semiconductor wafer 9 at every height can be detected with only one sensor pair 60a by elevating/lowering the sensor pair 60a. Note that the sensor 60 is not limited to a transmission type sensor and may be a reflection type sensor. Also, a position of the sensor 60 is not limited to the position in FIG. 2 to FIG. 4 and it is only required that the peripheral portions of the semiconductor wafers 9 are positioned between the sensors 60.

As illustrated in FIG. 2 and FIG. 3(a), the drive piece 56 of the main slide body 5 is originally suspended while pressing in the retreat detection switch SW2, in a state that the movable portion 31 advances, or a state that the second holding portions 4B hold the semiconductor wafers 9. In this state, the motor M is rotated. The first shaft 53 rotates and the first screw cylinder 51 and the main slide body 5 advance, as illustrated in FIG. 4. The rotation of the first shaft 53 is transmitted to the second shaft 54 via the ball spline mechanism 55. This rotation of the second shaft 54 results in the second screw cylinder 52 and the sub slide body 50 advancing. Namely, the main slide body 5 and the sub slide body 50 move forward and rearward synchronously. This advance of the main slide body 5 and the sub slide body 50 results in five linearly moving bodies of the first holding portion 4A and the second holding portion 4B elevating, as described below. When the drive piece 56 of the main slide body 5 presses in the advance detection switch SW1, the motor M stops and the main slide body 5 and the sub slide body 50 stop advancing.

As illustrated in FIG. 3(b), since the main slide body 5 also retreats in a state that the movable portion 31 retreats, the distal end portion of first shaft 53 and the rear end portion of the second shaft 54 are separated from each other at an interval larger than the interval in the advanced state of the movable portion 31. However, as the distal end portion of the first shaft 53 is fitted in the ball spline mechanism 55, the rotation of the first shaft 53 is transmitted to the second shaft 54 when the movable portion 31 advances again.

In this embodiment, the first holding portions 4A are not displaced in the horizontal direction relative to the main body portion 30. On the other hand, the second holding portions 4B are displaced in the forward and rearward direction relative to the main body portion 30 of the hand 3. Such configuration enables a drive system to be simplified since the operation of the second holding portions 4B does not need to be transmitted to the first holding portions 4A.

Figure 5:
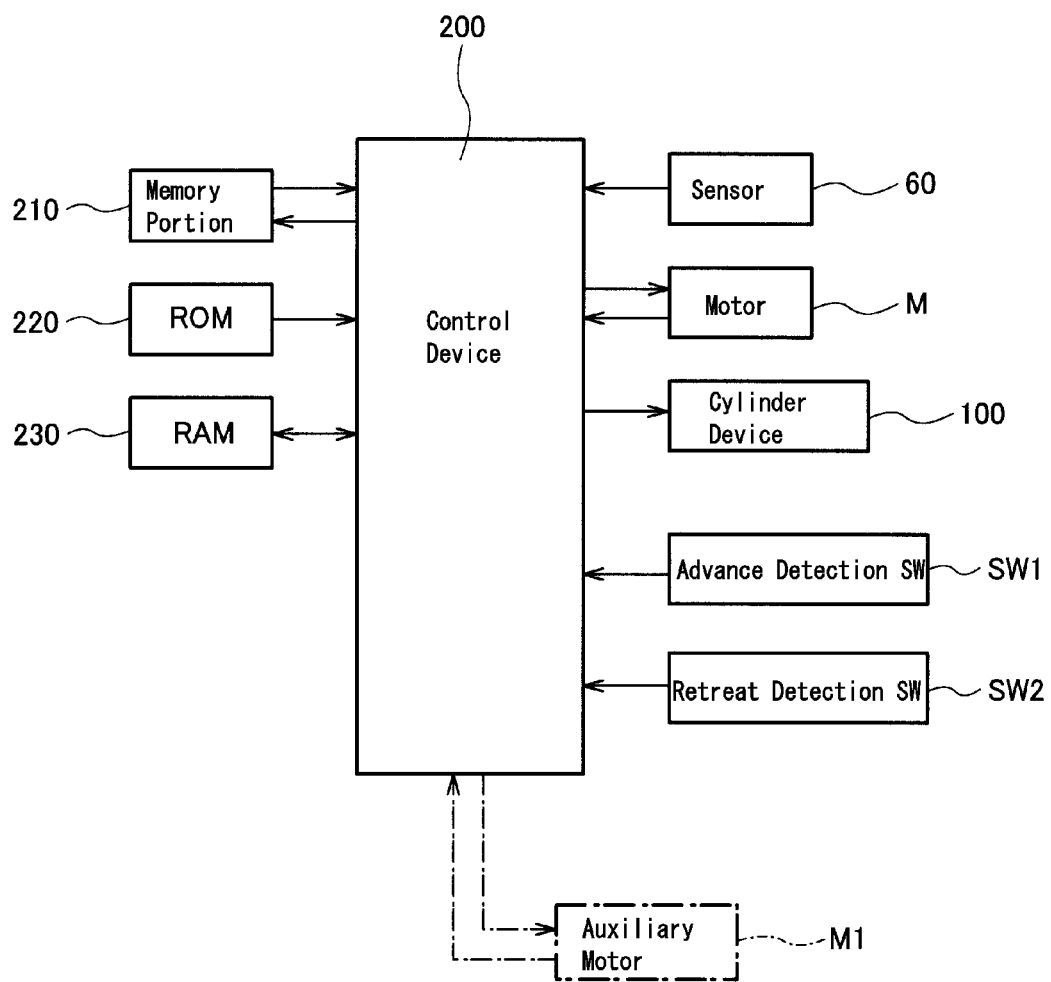
FIG. 5 is a block diagram illustrating a peripheral configuration of a control device.

FIG. 5 is a block diagram illustrating a peripheral configuration of the control device 200. Though the control device 200 is configured by one CPU, for example, it may be a combination of a plurality of CPUs. Also, a control portion 8 may also be used, combining CPU and ASIC (Application Specific Integrated Circuit)

To the control device 200, a memory portion 210 in which a presence/absence information of the semiconductor wafers 9 on the hand 3 obtained via the sensor 60 is stored, a ROM 220 in which an operation program is stored, and a RAM 230 working as a work memory for temporarily storing information are connected, in addition to the aforementioned sensor 60, the cylinder device 100, the motor M, the advance detection switch SW1, and the retreat detection switch SW2. The control device 200 determines whether the movable portion 31 is in the advanced state or in the retreated state based on the telescopic position of the piston 110 of the cylinder device 100.

<Configuration of First and Second Holding Portions>

Figure 6:
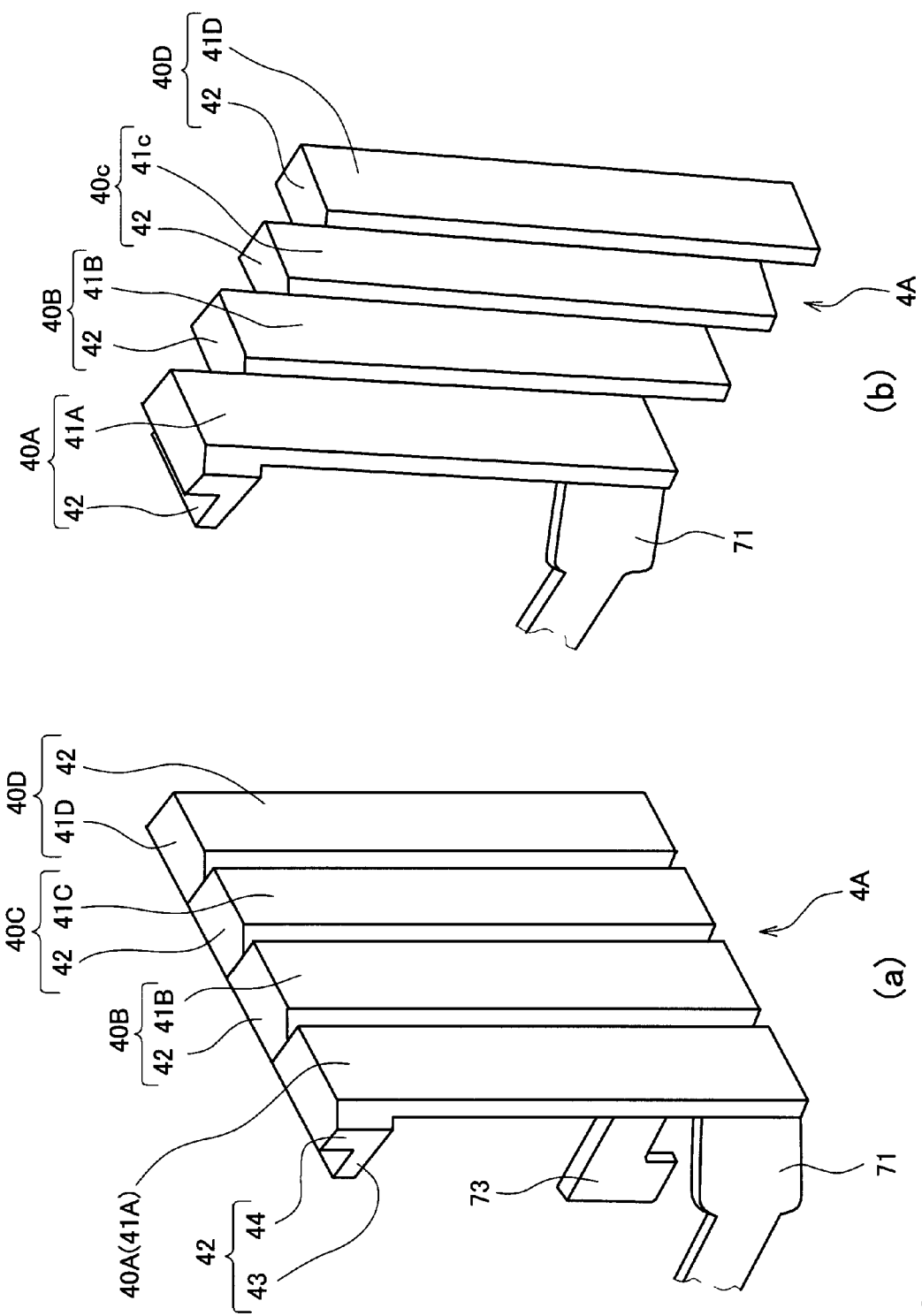
FIGS. 6 (a), (b) are perspective views of a first holding portion.

Hereunder, five linearly moving bodies configuring the first holding portions 4A and the second holding portions 4B will be described. FIGS. 6(a), (b) are perspective views of the first holding portion 4A. Though FIGS. 6(a), (b) illustrate the first holding portion 4A on the left of the main body portion 30 viewed from the front, the first holding portion 4A on the right of the main body portion 30 also has the same configuration.

The first holding portion 4A is provided with four linearly moving bodies 40A, 40B, 40C, 40D ranging along the peripheral portions of the semiconductor wafers 9 so as to correspond to the number of semiconductor wafers 9 to be gripped and elevated/lowered, and a pitch conversion mechanism for elevating the linearly moving bodies 40A, 40B, 40C, 40D by different heights, respectively. The reason why the number of semiconductor wafers 9 to be gripped is five, while the number of linearly moving bodies 40A, 40B, 40C, 40D is four is because the lowermost semiconductor wafer 9 is supported by receiving portions 42 fixed on the hand 3 and is not elevated/lowered.

The four linearly moving bodies 40A, 40B, 40C, 40D are provided so as to move vertically and each of the linearly moving bodies 40a, 40B, 40C, 40D is configured by providing the receiving portion 42 for supporting a lower surface of the peripheral portion of the semiconductor wafer 9 to a distal end portion, or an upper end portion of each linearly moving portion 41A, 41B, 41C, 41D which is a rectangular plate member.

The receiving portion 42 is formed such that a abutting wall 44 protrudes upward from a proximal end portion of a horizontal piece 43. The horizontal piece 43 receives and supports the lower surface of the peripheral portion of the semiconductor wafer 9 and the abutting wall 44 abuts on a circumferential surface of the semiconductor wafer 9. In a state that the first holding portion 4A and the second holding portion 4B hold each semiconductor wafer 9, the semiconductor wafer 9 is pressed and pinched by the abutting wall 44 of each receiving portion 42 of the first holding portion 4A and the abutting wall 44 of the second holding portion 4B inward, specifically, toward the center in the radial direction (refer to FIG. 7(c)). Namely, the semiconductor wafers 9 are gripped by the both holding portions 4A, 4B through edge grip. Thereby, the semiconductor wafers 9 are surely gripped even when the base 21 and the arm 20 rotate at high speed.

The four linearly moving portions 41A, 41B, 41C, 41D move from a state that the receiving portions 42 are of uniform height at a lowermost level as illustrated in FIG. 6(a) to a state that the receiving portions 42 are elevated by their respective linear distances corresponding to their respective height positions where the semiconductor wafers 9 to be received by the same receiving portions 42 are arranged, as illustrated in FIG. 6(b). The linearly moving portions 41A, 41B, 41C, 41D are elevated, for example, so that they are lower in sequence in the peripheral direction of the semiconductor wafer 9. Namely, the linearly moving portion 41A is elevated to the highest level and the linearly moving portion 41D is elevated to the lowest level. Thereby, a pitch, which is vertical intervals of a plurality of semiconductor wafers 9 held by the linearly moving portions 41A, 41B, 41C, 41D, is converted. In the description below, for convenience of explanation, it is provided that a linearly moving portion which is elevated to the highest level is called a first linearly moving portion 41A and hereunder, it is followed by the second, third, and fourth linearly moving portions 41B, 41C, 41D in the descending order of elevating height. Note that the elevating order of the first to fourth linearly moving portions 41A, 41B, 41C, 41D may be reverse to the above.

Note that the second holding portion 4B is, similar to the first holding portion 4A, configured to be provided with the four linearly moving portions 41A, 41B, 41C, 41D which are elevated so that they are higher or lower in sequence along the peripheral portion of the semiconductor wafer 9, and the pitch conversion mechanism. Each semiconductor wafer 9 is held by the receiving portions 42 of the first holding portions 4A and the receiving portions 42 of the second holding portions 4B positioned at the same height as the receiving portions 42 of the first holding portions 4A. In a state of being held by the receiving portions 42, each semiconductor wafer 9 is positioned in a plane substantially parallel to the facing surface of the hand 3. Namely, the facing surface 32 corresponds to "one plane" in the present invention and the vertical direction corresponds to "first direction" in the present invention. Also, the forward and rearward direction is "second direction" in the present invention.

In the embodiment in FIGS. 6(a), (b), all the horizontal pieces 43 provided in one first holding portion 4A are arranged so as not to overlap each other viewed from the top. This enables the pitch to be converted without the horizontal pieces 43 interfering with each other. Also, this enables the receiving portions 42 to be of uniform height at the lowermost level as illustrated in FIG. 6(a), and therefore, when the pitch is made smallest, the overall height of the distal end portion of the main body portion 30 and the first holding portions 4A can be small.

In addition, if at least two of a plurality of horizontal pieces 43 provided in one first holding portion 4A are arranged so as not to overlap each other viewed from the top, the pitch can be converted without at least the two horizontal pieces 43 interfering with each other.

Figure 7:
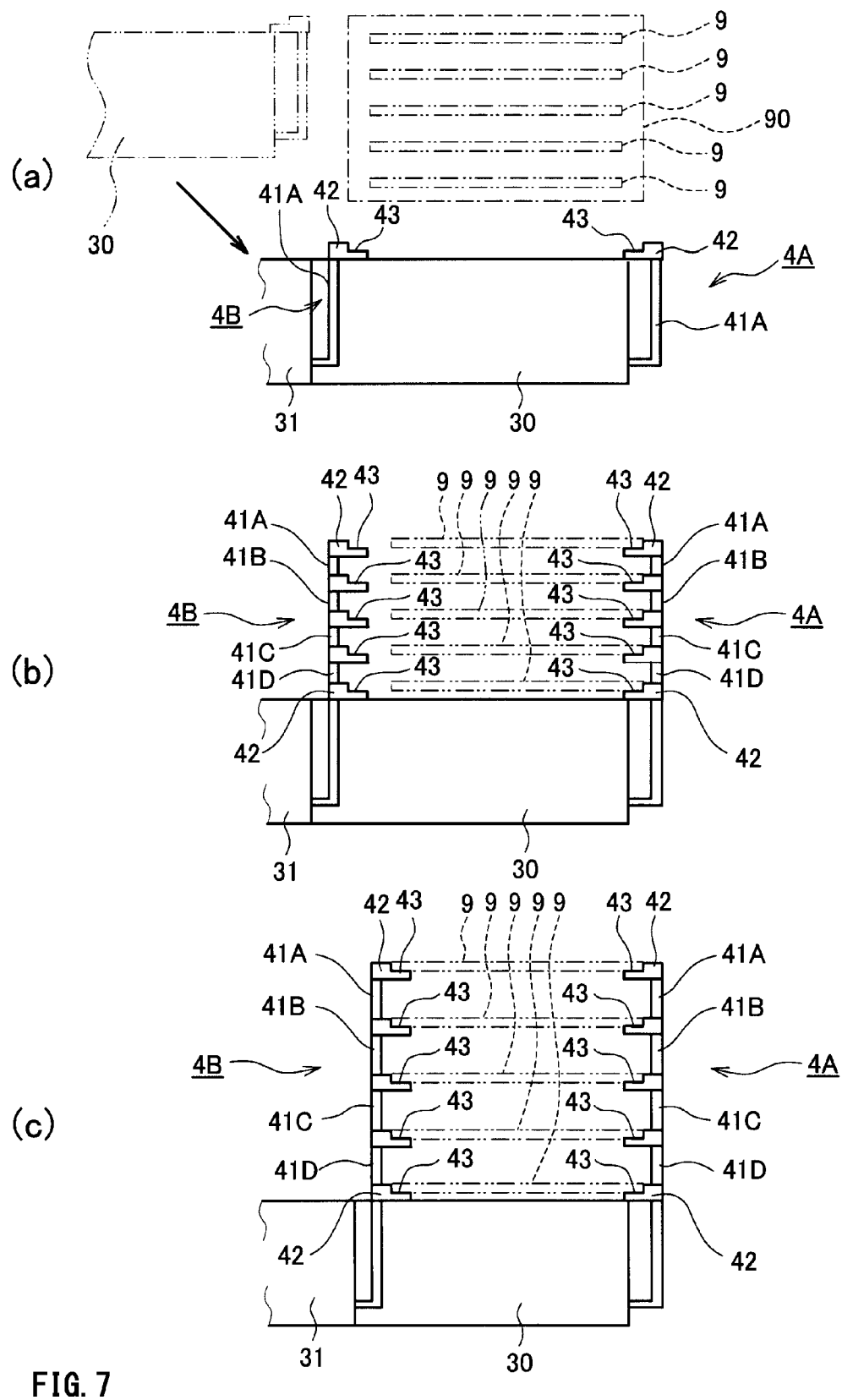
FIGS. 7 (a), (b), (c) are side views illustrating an example of an elevating/lowering operation of the first holding portion and a second holding portion while holding semiconductor wafers.

FIGS. 7(a), (b), (c) are side views illustrating an example of an elevating/lowering operation of the first holding portion 4A and the second holding portion 4B while holding the semiconductor wafers 9. However, the elevating/lowering operation while holding the semiconductor wafers 9 is not limited to this. In FIGS. 7(b), (c), the hoop 90 is not illustrated for convenience of explanation. The substrate conveyance robot 2 of this embodiment takes out five semiconductor wafers 9 at different heights from each other from the hoop 90 at a time and expands a pitch between adjacent semiconductor wafers 9. In this state, the semiconductor wafers 9 are conveyed to another place for treating them. The receiving portions 42 to receive the lowermost semiconductor wafer 9 are provided on the hand 3, and the first holding portions 4A and the second holding portions 4B elevate the other four semiconductor wafers 9.

In the state that the hand 3 faces the hoop 90 (refer to FIG. 1), and the movable portion 31 is in a state of being separated rearward from the main body portion 30, as illustrated in FIG. 3(b). From this state, the arm support shaft 23 is lowered, and the arm 20 and the base 21 rotate in the horizontal plane, causing the hand 3 to advance. The hand 3 passes under the hoop 90 and the first holding portions 4A are positioned on the forward side under the semiconductor wafers 9 in the hoop 90 and the second holding portions 4B are positioned on the rear side under the semiconductor wafers 9 in the hoop 90 respectively, as illustrated in FIG. 7(a). The first holding portions 4A and the second holding portions 4B are in the state that the respective receiving portions 42 are uniform at the lowermost level as illustrated in FIG. 6(a).

After that, as the arm support shaft 23 is elevated, the receiving portions 42 of the first to fourth linearly moving portions 41A, 41B, 41C, 41D are elevated by different heights, respectively, reaching heights corresponding to lower surfaces of the semiconductor wafers 9 to which the horizontal pieces 43 of the respective receiving portions 42 correspond, or positions slightly lower than the lower surfaces. After the arm support shaft 23 is slightly elevated and each receiving portion 42 holds the corresponding semiconductor wafer 9, the arm 20 and the base 21 rotate in the horizontal plane causing the hand 3 to retreat. As illustrated in FIG. 7(b), each receiving portion 42 of the first holding portions 4A comes into contact with the peripheral portion of the corresponding semiconductor wafer 9. The pitch between adjacent semiconductor wafers 9 is the shortest in this state. The second holding portions 4B are positioned in the rear of the semiconductor wafer 9.

After that, as illustrated in FIG. 3(a), by retracting the piston 110 into the housing 120, the movable portion 31 advances and the receiving portions 42 of the second holding portions 4B come into contact with the peripheral portions of the semiconductor wafers 9. In this state, the arm support shaft 23 is slightly elevated and the first holding portions 4A and the second holding portions 4B lift the semiconductor wafers 9 a little from the hoop 90. The arm 20 and the base 21 rotate in the horizontal plane and the hand 3 retreats so that the semiconductor wafers 9 can be taken out from the hoop 90.

After taking out the semiconductor wafers 9 from the hoop 90, the receiving portions 42 of the first to fourth linearly moving portions 41A, 41B, 41C, 41D are further elevated by different heights, respectively, so that the pitch between adjacent semiconductor wafers 9 can be expanded, as illustrated in FIG. 7(c). The arm 20 and the base 21 rotate in the horizontal plane so that a plurality of semiconductor wafers 9 with their pitch expanded are expended are conveyed to another place for treating them. Note that, in a state that the receiving portions 42 of all the linearly moving portions 41A, 41B, 41C, 41D have finished elevating, all the height differences between the receiving portions 42 of the adjacent linearly moving portions are expected to be equal. Hereunder, the pitch conversion mechanism 7 for elevating the receiving portions 42 of the linearly moving portions 41A, 41B, 41C, 41D by different heights, respective, will be described.

<Configuration and Operation of Pitch Conversion Mechanism>

Figure 8:
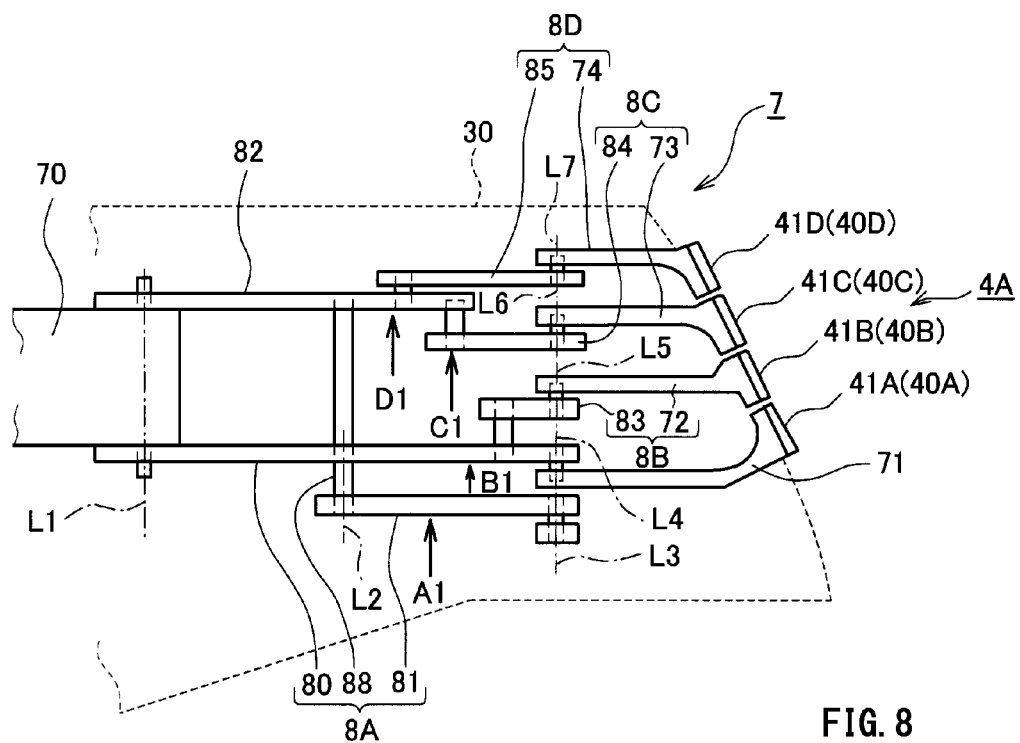
FIG. 8 is a plan view illustrating a storing space of the main body portion.
Figure 9:
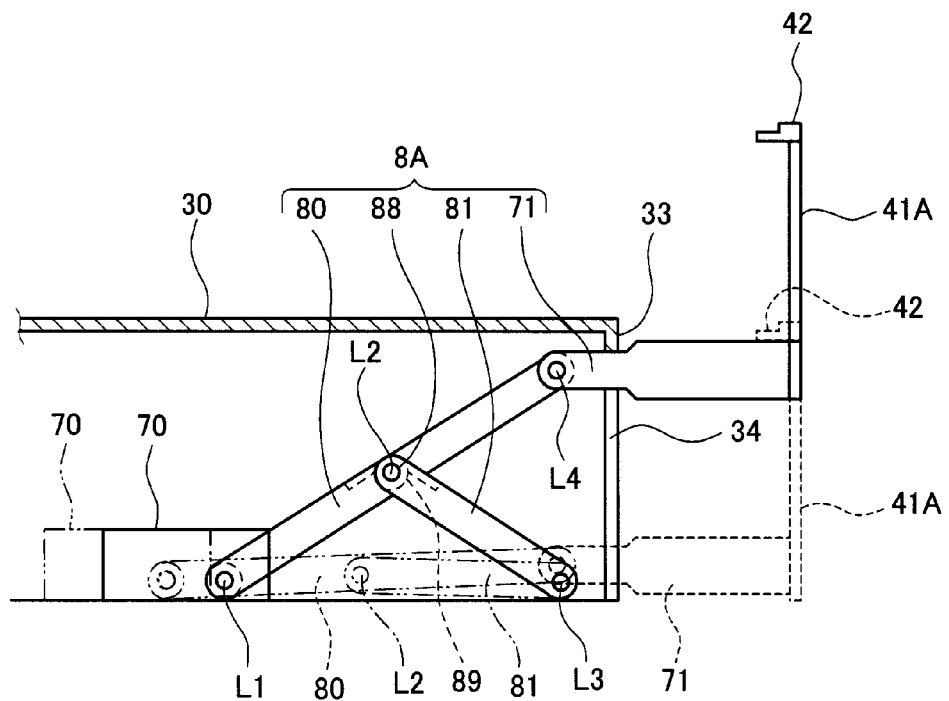
FIG. 9 is a side view of a pitch conversion mechanism in FIG. 8 viewed from the direction A1.

FIG. 8 is a plan view illustrating the storing space of the main body portion 30 of the hand 3, illustrating the aforementioned pitch conversion mechanism 7. FIG. 9 is a side view of the pitch conversion mechanism 7 in FIG. 8 viewed from the direction A1, not illustrating the base 21. The first holding portions 4A and the second holding portions 4B each comprise the same pitch conversion mechanism 7, and for convenience of explanation, FIG. 8 illustrates the pitch conversion mechanism 7 of the first holding portion 4A positioned on the left side of the hand 3 in FIG. 2. The pitch conversion mechanism 7 is provided with the aforementioned linearly moving portions 41A, 41B, 41C, 41D, the first slider 70 which slides in the main body portion 30 forward and rearward, and first to fourth link mechanisms 8A, 8B, 8C, 8D which are coupled to the first slider 70 and the respective linearly moving portions 41A, 41B, 41C, 41D so as to convert the forward and rearward movement of the first slider 70 into the vertical movement and which are arranged in the main body portion 30. Namely, in the pitch conversion mechanism 7, the first to fourth linearly moving portions 41A, 41B, 41C, 41D are positioned outside the main body portion 30, and the first slider 70 and the first to fourth link mechanisms 8A, 8B, 8C, 8D are positioned inside the main body portion 30. Also, since the semiconductor wafers 9 are positioned above the main body portion 30 as illustrated in FIG. 1, the first slider 70 and the first to fourth link mechanisms 8A, 8B, 8C, 8D of the pitch conversion mechanism 7 are present in the immediate vicinity of the receiving portions 42 which hold the semiconductor wafers 9. The first to fourth link mechanisms 8A, 8B, 8C, 8D configure "drive portion" of the present invention.

In FIG. 8, it is provided that the link mechanism positioned on the innermost side of the main body portion 30 is a first link mechanism 8A, and it is followed by the second, third, and fourth link mechanisms 8B, 8C, 8D in the order toward the outside. The first to fourth link mechanisms 8A, 8B, 8C, 8D are connected to the corresponding first to fourth linearly moving portions 41A, 41B, 41C, 41D.

As illustrated in FIG. 9, the first link mechanism 8A comprises a first link member 80 as a long plate which is provided to one side portion of the first slider 70 and a proximal end portion of which is pivotably mounted to the first slider 70, a second link member 81 whose distal end portion is pivotably mounted about a connecting shaft 88 positioned in the middle in the longitudinal direction of the first link member 80 and whose proximal end portion is pivotably mounted to a bottom surface of the main body portion 30, and a second slider 71 which is pivotably mounted to a distal end portion of the first link member 80 and fixed to a lower end portion of the first linearly moving portion 41. The first link member 80 pivots about a first axis line L1 which is the center of a mounting point to the first slider 70 and extending lateraly, and the connecting shaft 88 is centered at a second axis line L2 which is parallel to the first axis line L1. A mounting point of the second link member 81 to the bottom surface of the main body portion 30 is centered at a third axis line L3 which is parallel to the first axis line L1 and the second axis line L2. The second slider 71 is centered at a fourth axis line L4 which is parallel to the first axis line L1 and the second axis line L2. A distance between the second axis line L2 and the third axis line L3 is substantially equal to a distance between the first axis line L1 and the second axis line L2 as well as a distance between the second axis line L2 and the fourth axis line L4. The first axis line L1, the second axis line L2, and the fourth axis line L4 are substantially in the same plane.

The second slider 71 is fitted in a vertical long hole 34 formed in a front wall 33 as a front end portion of the main body portion 30, and its forward and rearward movement is restricted and only its vertical movement is permitted. Note that, as illustrated in FIG. 8, a proximal end portion of a third link member 82, which is a long plate shorter than the first link member 80, is mounted to a side portion of the first slider 70 opposite to the side to which the first link member 80 is provided, and the third link member 82 is provided so as to pivot about the first axis line L1. The aforementioned connecting shaft 88 is extended in parallel to the first axis line L1 and connected to the third link member 82. As mentioned below, when the first link member 80 and the second link member 81 pivot, the third link member 82 also pivots via the connecting shaft 88.

In a state that the first slider 70 retreats, as shown by the dotted line in FIG. 9, both the first link member 80 and the second link member 81 are in a substantially horizontal position, and the second slider 71 and the receiving portion 42 of the first linearly moving portion 41A are positioned at the lowermost level. As shown by the solid line in FIG. 9, when the first slider 70 advances, the first link member 80 pivots about the first axis line L1 so that the second slider 71 moves upward, since the second slider 71 cannot move forward and rearward and is only permitted to move vertically. The second link member 81 also pivots about the third axis line L3 so that the connecting shaft 88 moves upward. When the first slider 70 advances a predetermined distance, the second slider 71 and the receiving portion 42 of the first linearly moving portion 41 reach the uppermost level. When the first slider 70 retreats from this state, the first linearly moving portion 41A is lowered in a reverse operation to the above. Note that, the second link member 81 may be omitted since it supports the pivot of the first link member 80.

Note that, when the first slider 70 advances from the state that the first link member 80 and the second link member 81 are in the substantially horizontal position, the both link members 80, 81 could be stiff, not pivoting upward. In other words, if the second axis line L2 of the connecting shaft 88 is in a dead center position of the first link member 80 and the second link member 81, the both link members 80, 81 could be stiff, not pivoting upward. Accordingly, a torsion spring 89 shown by the dotted line in FIG. 9 may be provided around the connecting shaft 88 and leg pieces of the torsion spring 89 may be mounted to the first link member 80 and the second link member 81 so as to impart an upward bias to the connecting shaft 88. Also, if the second axis line L2 is positioned above the first axis line L1 and the third axis line L3 in the state that the second slider 71 is positioned at the lowermost level, the possibility that the both link members 80, 81 could be stiff when the first slider 70 advances is solved.

Figure 10:
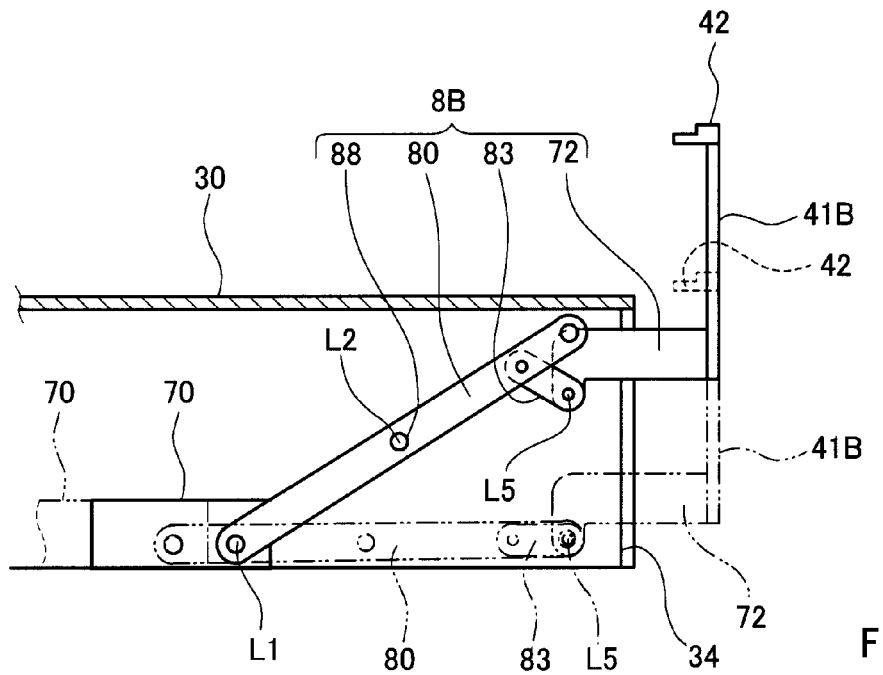
FIG. 10 is a side view of the pitch conversion mechanism in FIG. 8 viewed from the direction B1.

FIG. 10 is a side view of the pitch conversion mechanism 7 in FIG. 8 viewed from the direction B1, illustrating the second link mechanism 8B. The second link mechanism 8B comprises the aforementioned first link member 80, a fourth link member 83 whose one end portion is pivotably mounted to a distal end portion of the first link member 80, and a third slider 72 which is pivotably mounted to the other end portion of the fourth link member 83 and fixed to a lower end portion of the second linearly moving portion 41B. A mounting point of the fourth link member 83 and the third slider 72 is centered at a fifth axis line L5 which is parallel to the aforementioned fourth axis line L4 such that these axis lines are positioned on a substantially identical vertical plane. The fourth link member 83 is mounted on a surface opposite to the surface of the first link member 80 on which the second link member 81 is mounted.

In the state that the first slider 70 retreats, as shown by the dotted line in FIG. 10, both the first link member 80 and the fourth link member 83 are in a substantially horizontal position, and the third slider 72 and the receiving portion 42 of the second linearly moving portion 41B are positioned at the lowermost level. As shown by the solid line in FIG. 10, when the first slider 70 advances, the first link member 80 pivots about the first axis line L1 so that the third slider 72 moves upward, as mentioned above. When the first slider 70 advances a predetermined distance, the fourth link member 83 is inclined with the other end portion thereof moved downward by a weight of the second linearly moving portion 41B, and the third slider 72 and the receiving portion 42 of the second linearly moving portion 41B reach the uppermost level.

Figure 11:
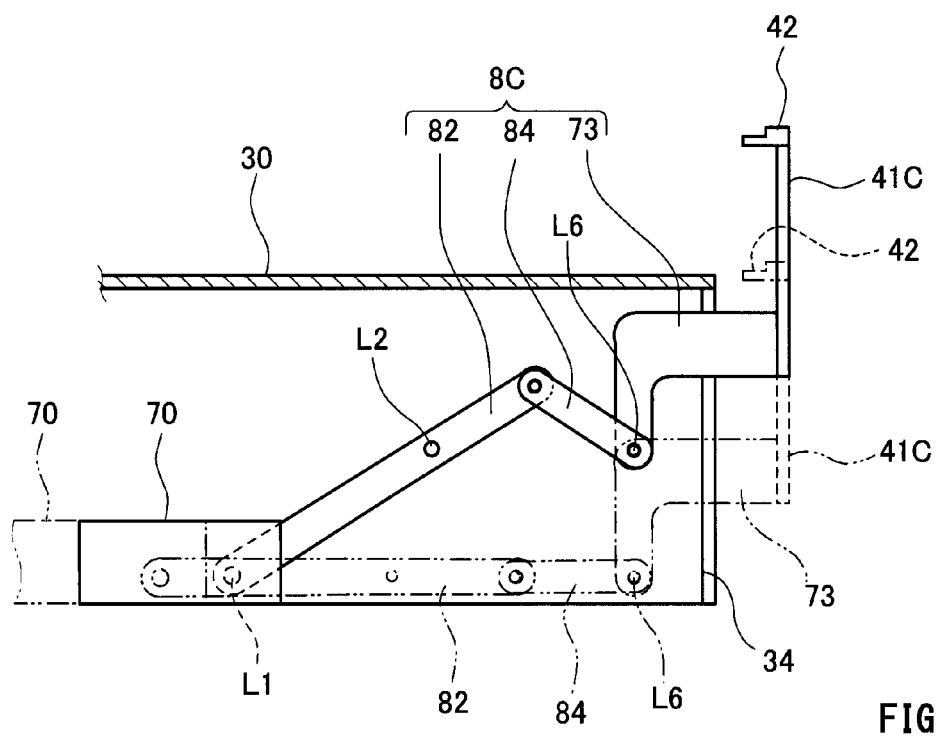
FIG. 11 is a side view of the pitch conversion mechanism in FIG. 8 viewed from the direction C1.

FIG. 11 is a side view of the pitch conversion mechanism 7 in FIG. 8 viewed from the direction C1, illustrating the third link mechanism 8C. The third link mechanism 8C comprises the aforementioned third link member 82, a fifth link member 84 whose one end portion is pivotably mounted to a distal end portion of the third link member 82, and a fourth slider 73 which is pivotably mounted to the other end portion of the fifth link member 84 and fixed to a lower end portion of the third linearly moving portion 41C. A mounting point of the fifth link member 84 and the fourth slider 73 is centered at a sixth axis line L6 which is parallel to the fourth axis line L4 and positioned on the above-mentioned vertical plane.

In the state that the first slider 70 retreats, as shown by the dotted line in FIG. 11, both the third link member 82 and the fifth link member 84 are in a substantially horizontal position, and the fourth slider 73 and the receiving portion 42 of the third linearly moving portion 41C are positioned at the lowermost level. As shown by the solid line in FIG. 11, when the first slider 70 advances, the third link member 82 pivots about the first axis line L1 so that the fourth slider 73 moves upward, as mentioned above. When the first slider 70 advances a predetermined distance, the fifth link member 84 is inclined with the other end portion thereof moved downward by a weight of the third linearly moving portion 41C, and the fourth slider 73 and the receiving portion 42 of the third linearly moving portion 41C reach the uppermost level.

Figure 12:
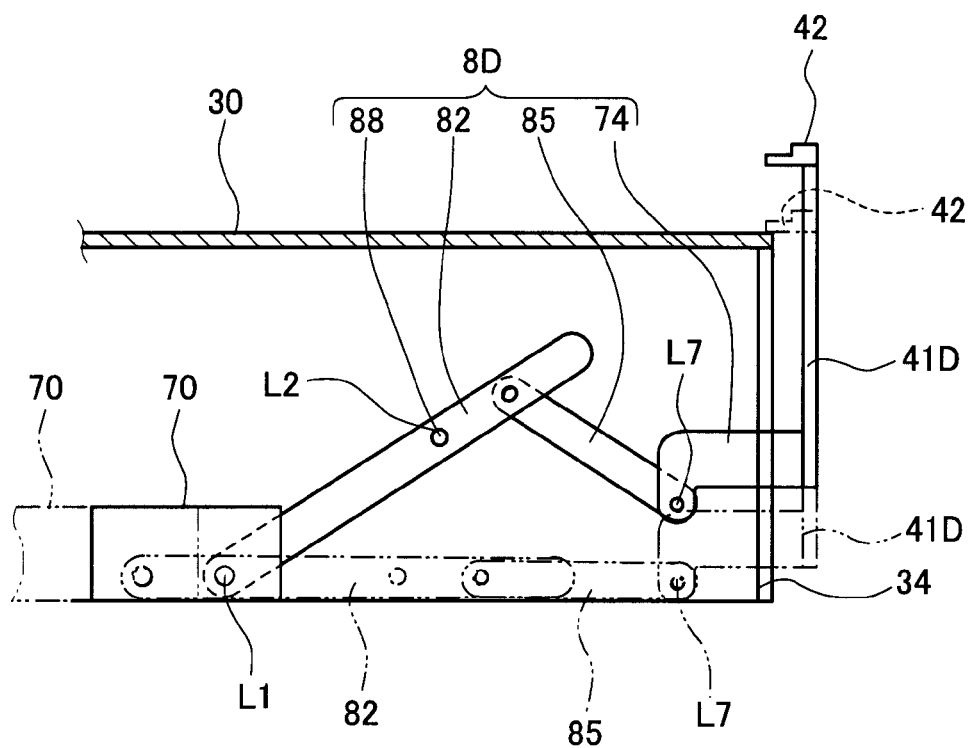
FIG. 12 is a side view of the pitch conversion mechanism 7 in FIG. 8 viewed from the direction D1.

FIG. 12 is a side view of the pitch conversion mechanism 7 in FIG. 8 viewed from the direction D1, illustrating the fourth link mechanism 8D. The fourth link mechanism 8D comprises the aforementioned third link member 82, a sixth link member 85 whose one end portion is pivotably mounted to a distal end portion of the third link member 82, and a fifth slider 74 which is pivotably mounted to the other end portion of the sixth link member 85 and fixed to a lower end portion of the fourth linearly moving portion 41D. A mounting point of the sixth link member 85 and the fifth slider 74 is centered at a seventh axis line L7 which is parallel to the fourth axis line L4 and positioned on the above-mentioned vertical plane. The sixth link member 85 is mounted on a surface opposite to the surface of the third link member 82 on which the fifth link member 84 is mounted.

In the state that the first slider 70 retreats, as shown by the dotted line in FIG. 12, both the third link member 82 and the sixth link member 85 are in a substantially horizontal position, and the fifth slider 74 and the receiving portion 42 of the fourth linearly moving portion 41D are positioned at the lowermost level.

As shown by the solid line in FIG. 12, when the first slider 70 advances, the third link member 82 pivots about the first axis line L1 so that the fifth slider 74 moves upward, as mentioned above. When the first slider 70 advances a predetermined distance, the sixth link member 85 is inclined with the other end portion thereof moved downward by a weight of the fourth linearly moving portion 41D, and the fifth slider 74 and the receiving portion 42 of the fourth linearly moving portion 41D reach the uppermost level.

The aforementioned torsion spring 89 may be fitted to the connecting shaft 88 and leg pieces of the torsion spring 89 may be mounted to the third link member 82 and the sixth link member 85 so as to impart an upward bias to the connecting shaft 88.

Note that, though the pitch conversion mechanism 7 of the first holding portion 4A provided to the main body portion 30 is described above, the second holding portion 4B provided to the movable portion 31 also has the pitch conversion mechanism 7 in the same configuration as above. Accordingly, the receiving portions 42 of the both holding portions 4A, 4B holding the semiconductor wafers 9 can be changed in height by the pitch conversion mechanisms 7. The four pitch conversion mechanisms 7 in total of the first holding portions 4A and the second holding portions 4B are synchronously driven. Namely, the first sliders 70 of the four pitch conversion mechanisms 7 are synchronously driven by the main slide body 5 and the sub slide body 50.

As mentioned above, the respective mounting points of the link members 81, 83, 84, 85 and the sliders 71, 72, 73, 74 which drive the first to fourth linearly moving portions 41A, 41B, 41C, 41D to be elevated/lowered are centered at the fourth to seventh axis lines L4 to L7 all positioned in the same vertical plane. Namely, all of the plurality of mounting points are in the same position in the forward and rearward direction.

In addition, the first link member 80 and the third link member 82 pivot synchronously with each other via the connecting shaft 88 passing the second axis line L2. Namely, when the first link member 80 and the third link member 82 are in a horizontal state, the respective sums of a first distance between the first axis line L1 and the second axis line L2 and respective second distances between the second axis line L2 and the fourth to seventh axis lines L4 to L7 are the same for the first to fourth link mechanisms 8A, 8B, 8C, 8D.

As for the first to fourth link mechanisms 8A, 8B, 8C, 8D, the mounting portions of the second link member 81 and the fourth link member 83 on the first link member 80, and the mounting portions of the fifth link member 84 and the sixth link member 85 on the second link member 81 are in different positions in the forward and rearward direction. Accordingly, the respective second distances between the second axis line L2 and the fourth to seventh axis lines L4 to L7 when the first link member 80 and the third link member 82 elevatingly pivot are different for the first to fourth link mechanisms 8A, 8B, 8C, 8D. Namely, since the predetermined distance as an advancing distance of the first slider 70 is the same for the first to fourth link mechanisms 8A, 8B, 8C, 8D, the ratios of the respective second distances to the predetermined distance when the first link member 80 and the third link member 82 elevatingly pivot are different for the first to fourth linearly moving portions 41A, 41B, 41C, 41D.

This results in elevating heights of the respective receiving portions 42 of the first to the fourth linearly moving portions 41A, 41B, 41C, 41D being different from each other. Namely, a link mechanism can be suitably realized where the first to fourth linearly moving portions 41A, 41B, 41C, 41D are elevated according to the corresponding height positions of the semiconductor wafers 9 to be held by the respective receiving portions 42 of the first to fourth linearly moving portions 41A, 41B, 41C, 41D.

When component members of the first to fourth link mechanisms 8A, 8B, 8C, 8D are pivoted as above in order to convert the pitch of vertically adjacent semiconductor wafers 9, the component members of the link mechanisms sometimes rub each other resulting in generation of particles. Adhesion of such particles to the semiconductor wafers 9 could result in quality failure of the semiconductor wafers 9.

In this embodiment, the first to fourth link mechanisms 8A, 8B, 8C, 8D are arranged in the main body portion 30 and the movable portion 31 of the hand 3, and therefore said particles never go out of the main body portion 30 and the movable portion 31 and there is no possibility that said particles adhere to the semiconductor wafers 9. Further, the inside of the main body portion 30 and the movable portion 31 is set to negative pressure so that the particles do not go out of the main body portion 30 and the movable portion 31.

Incidentally, the pitch conversion mechanism 7 is positioned immediately below the receiving portions 42 of the linearly moving bodies 40A, 40B, 40C, 40D. Thereby, accuracy in operation of converting intervals between the receiving portions 42 can be enhanced.

<Operation of Detector Moving Mechanism>

As mentioned above, the vertically adjacent semiconductor wafers 9 are elevated by the advance of the main slide body 5 so that the pitch is expanded. Also, the elevating/lowering pole 63 and the sensor 60 are elevated/lowered by the forward and rearward movement of the main slide body 5. In this embodiment, the presence of every semiconductor wafer 9 is detected by one sensor pair 60*a* by lowering the sensor pair 60*a* when the main slide body 5 advances.

Figure 13:
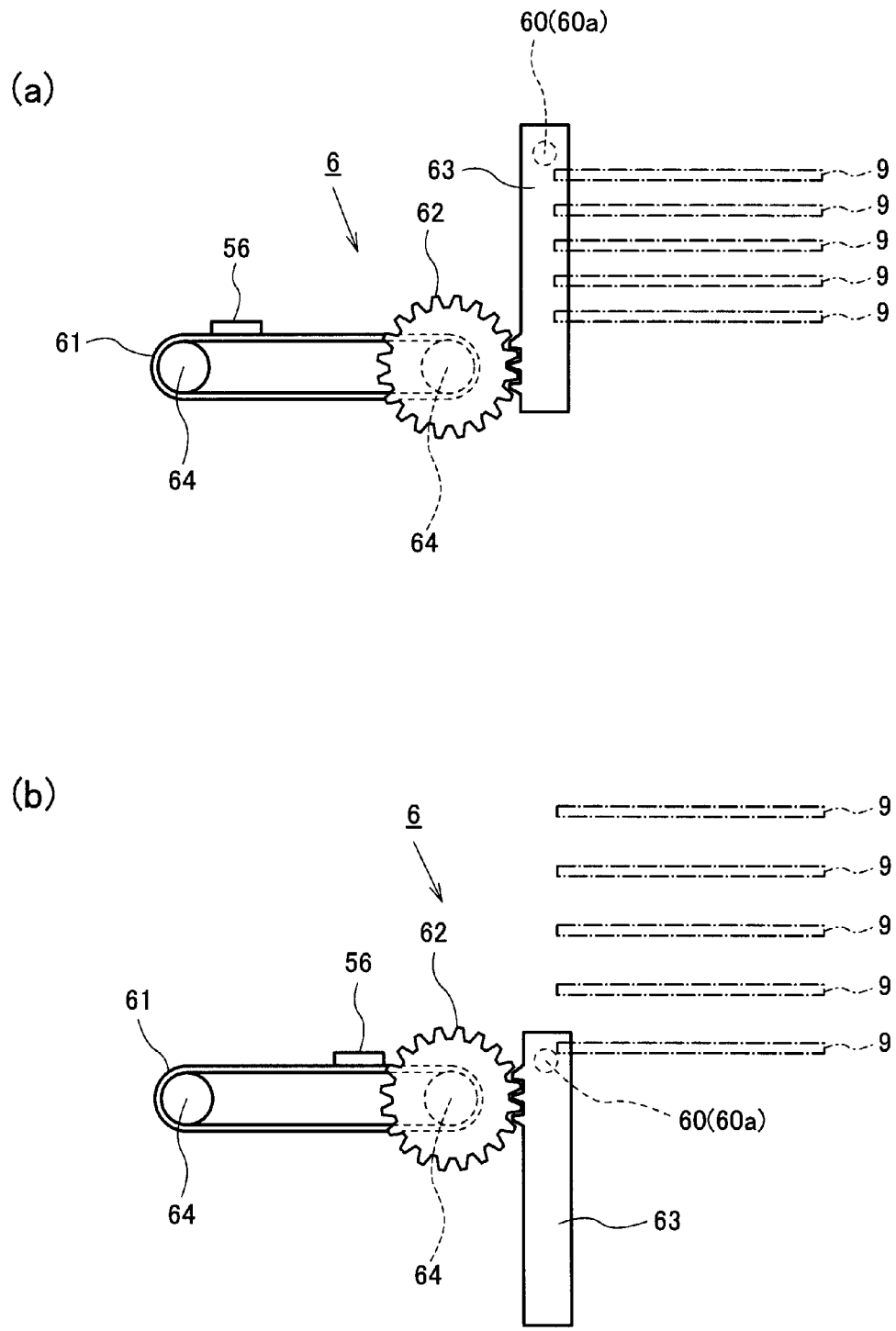
FIGS. 13 (a), (b) illustrate a detector moving mechanism in FIGS. 3 (a), (b) and FIG. 4 viewed from the direction F1.

FIGS. 13 (*a*), (*b*) illustrate the detector moving mechanism 6 in FIGS. 3 (*a*), (*b*) and FIG. 4 viewed from the direction F1; FIG. 13(*a*) illustrating a retreated state of the drive piece 56 of the main slide body 5, FIG. 13(*b*) illustrating an advanced state of the drive piece 56, respectively. The aforementioned endless belt 61 configuring the detector moving mechanism 6 is stretched between a pair of rollers 64 separated forward and rearward, and the drive piece 56 is mounted on an upper side of the endless belt 61. The pinion gear 62 is fitted to the forward roller 64 coaxially. When the drive piece 56 advances, the pinion gear 62 rotates clockwise resulting in the elevating/lowering pole 63 and the sensor 60 being lowered. In contrast, when the drive piece 56 retreats, the pinion gear 62 rotates counterclockwise resulting in the elevating/lowering pole 63 and the sensor 60 being elevated.

As illustrated in FIG. 13(*a*), when the drive piece 56 is in the retreated state, the elevating/lowering pole 63 and the sensor 60 are in the most elevated position, and the five semiconductor wafers 9 are placed on the receiving portions 42 at the narrowest pitch, as mentioned above. The sensor 60 is positioned above the uppermost semiconductor wafer 9.

When the drive piece 56 advances from this state, the sensor 60 is lowered. As the semiconductor wafers 9 are elevated so that the pitch is expanded, the presence of every semiconductor wafer 9 can be detected during the lowering of the sensor 60. In contrast, when the drive piece 56 retreats, the semiconductor wafers 9 are lowered so that the pitch is shortened, while the sensor 60 is elevated in reverse, and therefore the presence of every semiconductor wafer 9 can be detected during the elevating. This means that a maximum moving distance of the sensor 60 required to detect the presence of every semiconductor wafer 9 is less than an interval between the uppermost semiconductor wafer 9 and the lowermost semiconductor wafer 9 in a state that the pitch between the adjacent semiconductor wafers 9 is set to the widest. Consequently, a thinner and smaller end effector device 1 can be achieved.

In other words, elevating the sensor 60 so as to detect the semiconductor wafers 9 when the pitch of the semiconductor wafers 9 is expended leads to a disadvantage below. The maximum moving distance of the sensor 60 required to detect the presence of every semiconductor wafer 9 would be more than the interval between the uppermost semiconductor wafer 9 and the lowermost semiconductor wafer 9 in the state that the pitch between the adjacent semiconductor wafers 9 is set to the widest. This is disadvantageous to achieve a thinner and smaller end effector device 1, and therefore, a pitch expanding/contracting direction of the semiconductor wafers 9 and an elevating/lowering direction of the sensor 60 are set in reverse directions.

Also, the pitch conversion mechanism 7 and the detector moving mechanism 6 are linked mutually and driven by one common motor M. Namely, the motor M configures "drive source" of the present invention. This simplifies a configuration for driving the pitch conversion mechanism 7 and the detector moving mechanism 6. Also, this enables the pitch conversion mechanism 7 and the detector moving mechanism 6 to be readily synchronized and driven.

<Overview of End Effector Device Operation>

Figure 14:
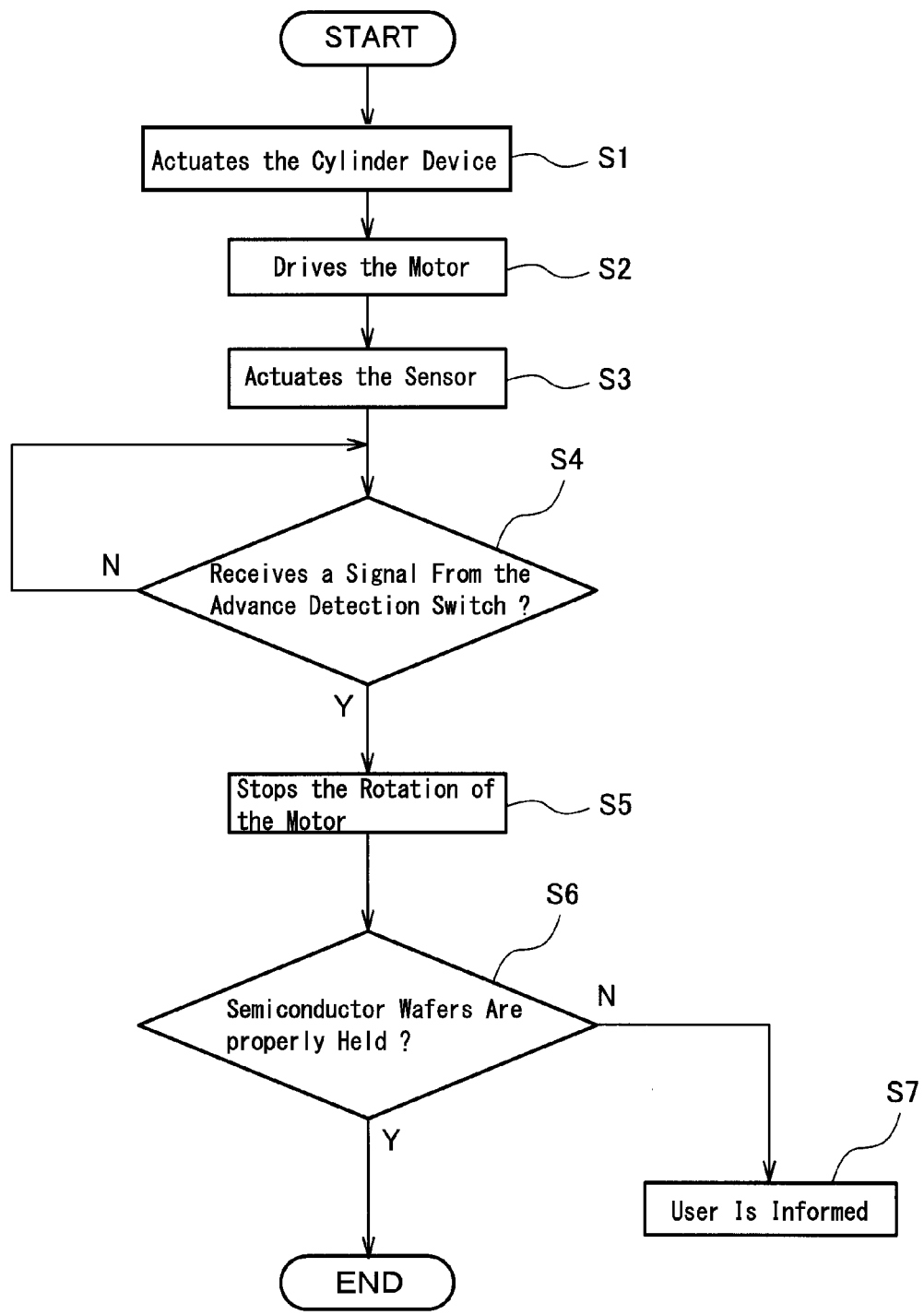
FIG. 14 is a flow chart illustrating an operation outline of the end effector device.

The flow chart in FIG. 14 illustrates an overview of an operation of the end effector device 1 comprising the configuration above, or an operation of detecting the semiconductor wafers 9 upon pitch conversion.

The control device 200 actuates the cylinder device 100 (step S1) causing the movable portion 31 to approach the main body portion 30 so that the five semiconductor wafers 9 vertically arranged are held by the receiving portions 42 of the first holding portions 4A and the second holding portions 4B. Next, the motor M is drivn (step S2) to advance the first slider 70 so as to expand the pitch of the semiconductor wafers 9. The control device 200 actuates the sensor 60 at the same time (step S3) and causes the memory portion 210 to memorize a detection signal from the sensor 60. The control device 200 stops the rotation of the motor M (step 5) when receiving a signal from the advance detection switch SW1 (step S4). Since the pitch of the semiconductor wafers 9 becomes maximum in the state that the first slider 70 has finished advancing while the sensor 60 has finished lowering, the presence of all of the five semiconductor wafers 9 is detected by this sensor 60. The control device 200 detects whether or not the five semiconductor wafers 9 are properly held by the receiving portions 42 of the first holding portions 4A and the second holding portions 4B based on the information in the memory portion 210 (step S6). If the five semiconductor wafers 9 are not properly held by the receiving portions 42 of the first holding portions 4A and the second holding portions 4B, for example, if only four semiconductor wafers 9 are held by the receiving portions 42, a user is informed of that (step S7). When the five semiconductor wafers 9 are properly held by the receiving portions 42 of the first holding portions 4A and the second holding portions 4B, that is displayed and also the five semiconductor wafers are conveyed to another place for performing a predetermined treatment.

Figure 15:
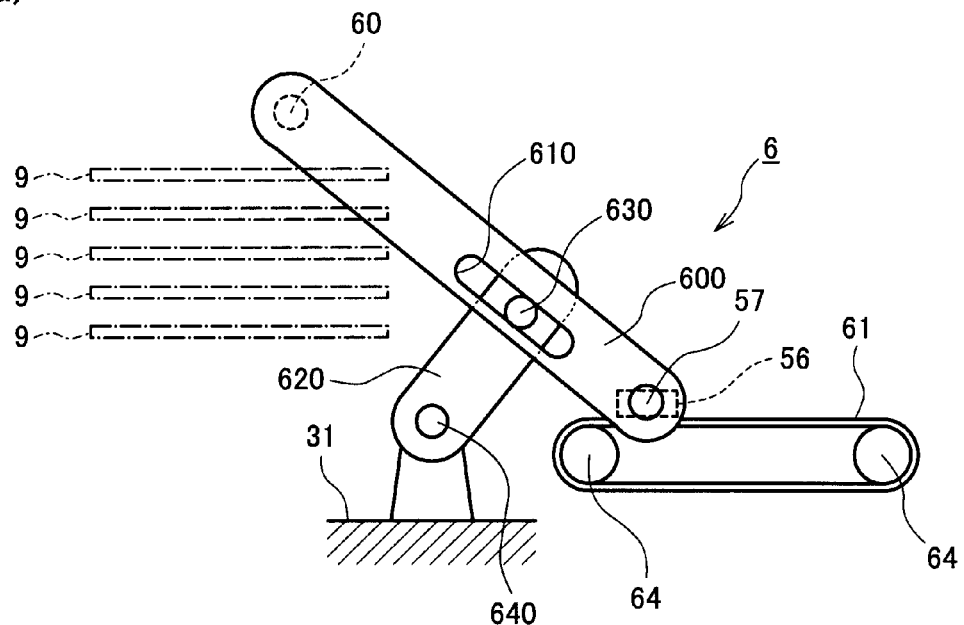
FIGS. 15 (a), (b) illustrate a configuration of another detector moving mechanism.
Figure 15:
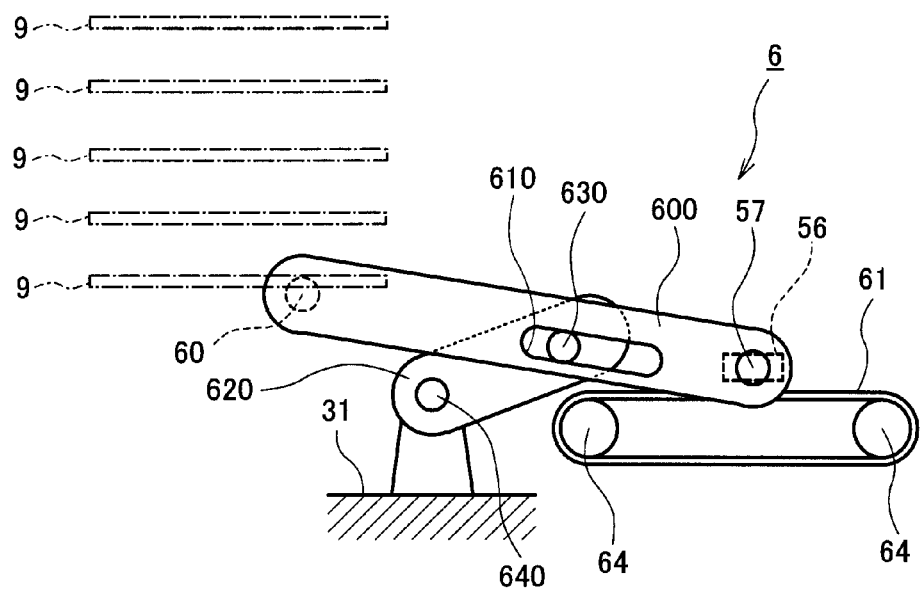

FIGS. 15 (a), (b) illustrate a configuration of another detector moving mechanism 6; (a) illustrating the retreated state of the drive piece 56, (b) illustrating the advanced state of the drive piece 56, respectively. A round shaft 57 protrudes from the drive piece 56 mounted to the endless belt 61, and a proximal end portion of a sensor link 600 is fitted to the round shaft 57. The aforementioned sensor 60 is provided to a distal end portion of the sensor link 600 and a long hole 610 is formed at the middle portion in the longitudinal direction of the sensor link 600.

One end portion of a support link 620 is rotatably mounted to a rotation center shaft 640 provided on the movable portion 31, and a fitting shaft 630 is provided to a distal end portion of this support link 620. This fitting shaft 630 is slidably fitted in the long hole 610 so as to support the sensor link 600.

As illustrated in FIG. 15(a), in the state that the drive piece 56 retreats, the sensor link 60 is inclined such that its distal end portion is elevated and the sensor 60 is positioned above the uppermost semiconductor wafer 9. The five semiconductor wafers 9 are placed on the receiving portions 42 at the narrowest pitch, as mentioned above.

When the drive piece 56 and the round shaft 57 advance from this state as illustrated in FIG. 15(b), the sensor link 600 swings downward about the round shaft 57 while the long hole 610 is slidingly guided by the fitting shaft 630. In contrast, the semiconductor wafers 9 are elevated such that the pitch is expanded, and therefore the presence of every semiconductor wafer 9 can be detected during the lowering of the sensor 60. In contrast, when the drive piece 56 retreats, the semiconductor wafers 9 are lowered such that the pitch is shortened while the sensor 60 is elevated in reverse, and therefore the presence of every semiconductor wafer 9 can be detected during the elevation. Namely, a pitch expanding/contracting direction of the semiconductor wafers 9 and an elevating/lowering direction of the sensor 60 are in reverse directions mutually. This allows the maximum moving distance of the sensor 60 required to detect the presence of every semiconductor wafer 9 to be less than the interval between the uppermost semiconductor wafer 9 and the lowermost semiconductor wafer 9 in the state that the pitch between the adjacent semiconductor wafers 9 is set to the widest. Consequently, a thinner and smaller end effector device 1 can be achieved according to this configuration as well. Note that a torsion spring (not illustrated) may be provided to the rotation center shaft 640 so as to impart an upward bias to the support link 620.

<Another Detector Moving Mechanism>

Figure 16:
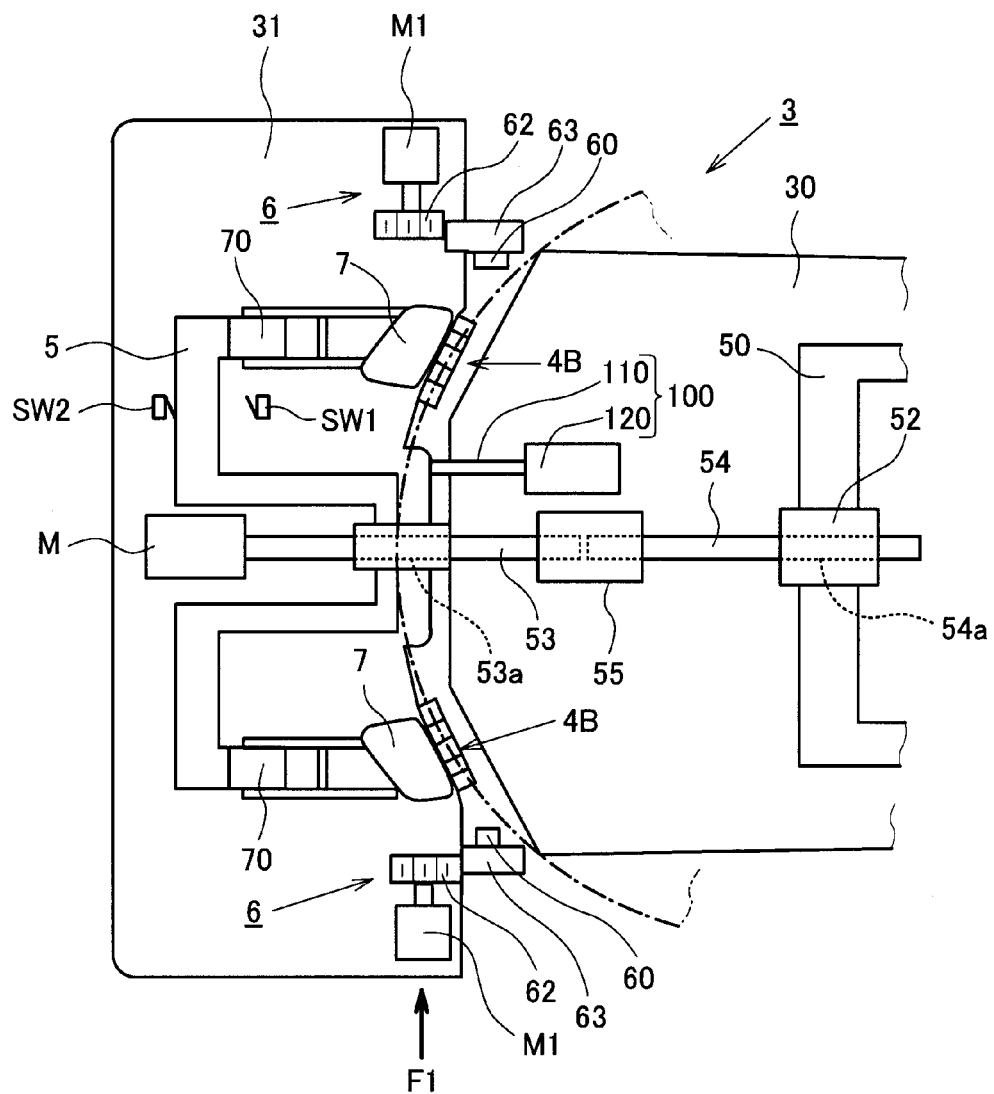
FIG. 16 is a plan view illustrating a configuration of another detector moving mechanism.
Figure 17:
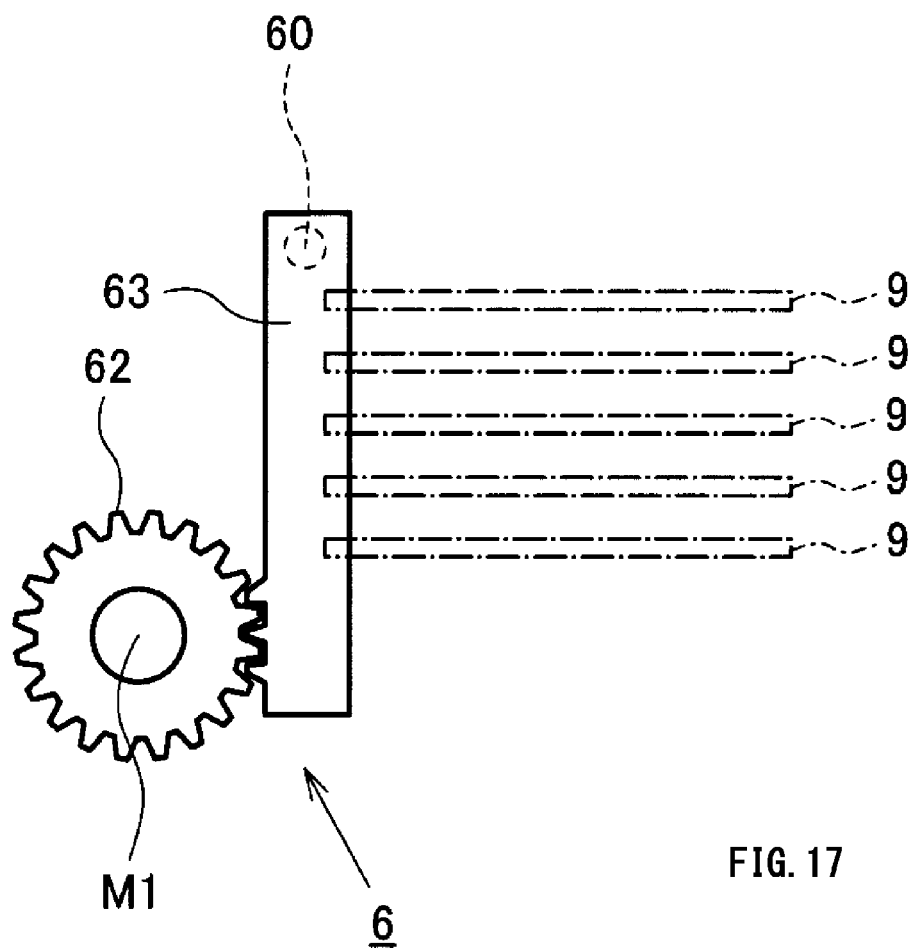
FIG. 17 illustrates the detector moving mechanism in FIG. 16 viewed from the direction F1.

FIG. 16 is a plan view illustrating a configuration of another detector moving mechanism 6, and FIG. 17 illustrates the detector moving mechanism 6 in FIG. 16 viewed from the direction F1. Although this detector moving mechanism 6 has the same configuration as illustrated in FIGS. 2 to 4 in that the elevating/lowering poles 63 provided with the sensor 60 are driven by the respective pinion gears 62, the pinion gears 62 are driven by their respective auxiliary motors M1 different from the motor M. These auxiliary motors M1 are arranged in the movable portion 31 and connected to the control device 200 as illustrated in FIG. 5. Accordingly, the endless belts 61 and the drive pieces 56 are not necessary, and the elevating/lowering operation of the sensor 60 and the pitch conversion operation of the semiconductor wafers 9 are mutually independent. Elevating/lowering the sensor 60 and the elevating/lowering poles 63 by the auxiliary motors M1 enables the presence of the five semiconductor wafers 9 to be detected in the state that the pitch between the adjacent semiconductor wafers 9 is set to minimum, as illustrated in FIG. 17. Accordingly, the elevating/lowering distance of the sensor 60 can be shortened enabling a thinner and smaller end effector device 1 to be achieved.

<Effect of Embodiment>

The end effector device 1 according to this embodiment has effects below.

1. A plurality of semiconductor wafers 9 are arranged at intervals in the vertical direction on the hand 3. One sensor pair 60a moves in the vertical direction by means of the detector moving mechanism 6, enabling the presence of every semiconductor wafer 9 to be detected by the one sensor pair 60a. Namely, as a corresponding number of sensors 60 to the number of semiconductor wafers 9 do not need to be provided, the configuration of detecting the presence of the semiconductor wafers 9 is simplified, resulting in cost reduction of the end effector device 1 as a whole.

2. As the pitch conversion mechanism 7 includes sliding or rotating members such as the link members 81, 83, 84, 85 and the sliders 71, 72, 73, 74, and the like, particles such as dust could be generated upon slide and rotation. However, the pitch conversion mechanism 7 is arranged in the main body portion 30 and the movable portion 31, and therefore the particles do not go out of the main body portion 30 and the movable portion 31 and do not adhere to the semiconductor wafers 9 received by the receiving portions 42 of the linearly moving bodies which are positioned outside the main body portion 30 and the movable portion 31. Thereby, the semiconductor wafers 9 can be prevented from being contaminated by particles caused by the pitch conversion mechanism 7.

Holding the semiconductor wafer 9 herein means making the semiconductor wafer 9 in a state that it can be conveyed by the hand 3, and aspects such as placing and sucking may be employed other than the embodiment above. In this case, the aforementioned receiving portion 42 may be configured by only the horizontal piece 43 or by the horizontal piece 43 and an suction pad.

Though two first holding portion 4A and two second holding portion 4B are provided in the description above, one or more of each may be provided. However, as the semiconductor wafer 9 needs to be supported at three or more points relative to the periphery of the semiconductor wafer 9 for positioning the same in a horizontal plane, the first holding portion 4A and the second holding portion 4B need to be provided such that they support at three or more points in total. Also, though the pitch conversion mechanism 7 expands the vertical pitch between the adjacent semiconductor wafers 9 when conveying a plurality of semiconductor wafers 9 from the hoop 90 to another place for treatment in the description above, said vertical pitch may be narrowed.

Though the embodiment that the four first sliders 70 are synchronously driven forward and rearward is described above, the first slider 70 of each pitch conversion mechanism 7 does not necessarily need to be physically connected to the first holding portion 4A or the second holding position 4B. For example, an individual actuator such as air cylinder may be provided to each first slider 70 of each pitch conversion mechanism 7. In this case, it is desired to synchronize operation timings of the individually provided actuators such as air cylinder. In the embodiment above, the pitch of the semiconductor wafers 9 is expanded while the sensor 60 is lowered in reverse according to the advance of the main slide body 5. However, the pitch of the semiconductor wafers 9 may be expanded while the sensor 60 may be lowered in reverse according to the retreat of the main slide body 5 as long as the pitch expanding/contracting direction of the semiconductor wafers 9 and the elevating/lowering direction of the sensor 60 are in reverse directions mutually.

<Variation of Receiving Portion>

In the description above, the lower surface of the peripheral portion of the semiconductor wafer 9 is supported by the horizontal piece 43 of the receiving portion 42, as illustrated in FIG. 6(a). However, instead, the receiving portion 42 may be formed such that a first slope 45 and a second slope 46, which is inclined more gently than the first slope 45, continue in its inner surface so as to support the periphery of the semiconductor wafer 9 at boundaries SM of the both slopes 45, 46, as illustrated in FIG. 18.

Figure 18:
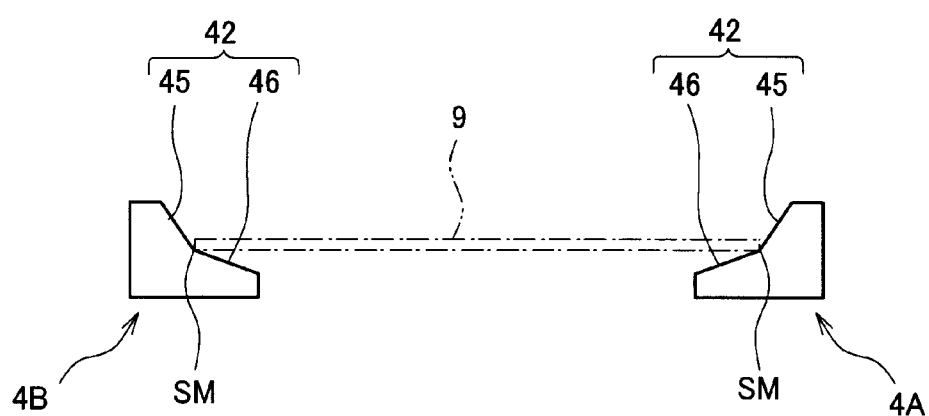
FIG. 18 is a side view illustrating a variation of a receiving portion.

In the configuration in FIG. 18, the semiconductor wafer 9 slides on the first slope 45 of the receiving portion 42 and is placed at the boundary SM to be held by the receiving portion 42. Thereby, a horizontal position and a horizontal attitude of the semiconductor wafer 9 are corrected allowing it to be held stably. Also, as the receiving portion 42 and the semiconductor wafer 9 are in line-contact with each other, a contact area between the receiving portion 42 and the semiconductor wafer 9 is small. Thereby, adhesion of foreign substances to the semiconductor wafer 9 is reduced.

INDUSTRIAL APPLICABILITY

The present invention is useful for an end effector device capable of detecting the presence of a plurality of substrates, which are arranged at vertical intervals, for each one of the substrates.

REFERENCE SIGNS LIST

1 . . . end effector device
2 . . . substrate conveyance robot
3 . . . hand
5 . . . main slide body
6 . . . detector moving mechanism
7 . . . pitch conversion mechanism
8A . . . link mechanism
9 . . . semiconductor wafer
30 . . . main body portion
31 . . . movable portion
40A . . . first linearly moving body
41A . . . first linearly moving portion
50 . . . sub slide body
60 . . . sensor

The invention claimed is:

1. An end effector device comprising:
a hand;
a plurality of holding portions that are provided to the hand, and that hold a plurality of substrates such that each substrate of the plurality of substrates is arranged: (1) substantially parallel to one plane and (2) at intervals in a first direction, the first direction being substantially orthogonal to the one plane;
a single detector that is arranged outside the plurality of substrates viewed from the first direction, and that is configured to be able to detect a presence of each one of the substrates which are held by the plurality of holding portions, opposing a peripheral portion of the substrate;
a detector moving mechanism that moves the single detector relative to the plurality of substrates in the first direction such that the single detector opposes the peripheral portion of every substrate, wherein
each of the holding portions includes a pitch conversion mechanism configured to move each receiving portion of a plurality of receiving portions that receive a peripheral portion of a corresponding substrate, and
the pitch conversion mechanism and the detector moving mechanism are linked mutually and driven by a common drive source.

2. The end effector device according to claim 1, wherein:
the plurality of receiving portions each receive the peripheral portion of the corresponding substrate with the substrate substantially parallel to the one plane, the receiving portions being arranged in the first direction corresponding to the number of the substrates; and the pitch conversion mechanism is configured to move each receiving portion in the first direction so as to convert the interval between adjacent substrates, and the detector moving mechanism moves the detector in the first direction oppositely to a direction that the pitch conversion mechanism converts the interval between adjacent substrates.

3. The end effector device according to claim 1, wherein the pitch conversion mechanism includes:

a plurality of linearly moving bodies each moving in the first direction and comprising a corresponding number of receiving portions to the number of the substrates; and a slider connected to the drive source and linearly moving in a second direction that is substantially parallel to the one plane so as to move the plurality of linearly moving bodies in the first direction, and wherein the detector moving mechanism is driven interlockingly with a linear movement of the slider.

4. The end effector device according to claim 3, wherein the hand includes a main body portion formed so as to extend in the second direction and having a distal end portion and a proximal end portion, and a movable portion connected on a proximal end side of the main body portion so as to advance and retreat in the second direction, the main body portion and the movable portion form their respective storing spaces therein, the pitch conversion mechanism including a drive portion arranged between the plurality of linearly moving bodies and the slider, and the drive portion is arranged in the storing spaces of the main body portion and the movable portion, the plurality of linearly moving bodies being provided outside the main body portion and the movable portion.

5. The end effector device according to claim 4, wherein the plurality of holding portions include a first holding portion provided to a distal end portion of the main body portion and a second holding portion provided to the movable portion, the end effector device being configured such that the peripheral portions of the plurality of substrates are held by the plurality of receiving portions of the first holding portion and the second holding portion when the movable portion advances, and the peripheral portions of the plurality of substrates are released from the receiving portions of the second holding portion when the movable portion retreats.

6. An end effector device comprising:

a hand;

a plurality of holding portions that are provided to the hand, and that hold a plurality of substrates such that each substrate of the plurality of substrates is arranged: (1) substantially parallel to one plane and (2) at intervals in a first direction, the first direction being substantially orthogonal to the one plane;

a single detector that is arranged outside the plurality of substrates viewed from the first direction, and that is configured to be able to detect a presence of each one of the substrates, opposing a peripheral portion of the substrate; and a detector moving mechanism that moves the single detector relative to the plurality of substrates in the first direction such that the single detector opposes the peripheral portion of every substrate, wherein each of the holding portions includes:

a plurality of receiving portions each receiving a peripheral portion of the corresponding substrate with the substrate substantially parallel to the one plane, the receiving portions being arranged in the first direction corresponding to the number of the substrates, and a pitch conversion mechanism configured to move each receiving portion in the first direction so as to convert the interval between adjacent substrates, the detector moving mechanism moves the detector in the first direction oppositely to a direction that the pitch conversion mechanism converts the interval between adjacent substrates, and the pitch conversion mechanism and the detector moving mechanism are linked mutually and driven by a common drive source.

7. The end effector device according to claim 6, wherein the pitch conversion mechanism includes:

a plurality of linearly moving bodies each moving in the first direction and comprising a corresponding number of receiving portions to the number of the substrates; and a slider connected to the drive source and linearly moving in a second direction that is substantially parallel to the one plane so as to move the plurality of linearly moving bodies in the first direction, and wherein the detector moving mechanism is driven interlockingly with a linear movement of the slider.

8. The end effector device according to claim 7, wherein the hand includes a main body portion formed so as to extend in the second direction and having a distal end portion and a proximal end portion, and a movable portion connected on a proximal end side of the main body portion so as to advance and retreat in the second direction, the main body portion and the movable portion form their respective storing spaces therein, the pitch conversion mechanism including a drive portion arranged between the plurality of linearly moving bodies and the slider, and the drive portion is arranged in the storing spaces of the main body portion and the movable portion, the plurality of linearly moving bodies being provided outside the main body portion and the movable portion.

9. The end effector device according to claim 8, wherein the plurality of holding portions include a first holding portion provided to a distal end portion of the main body portion and a second holding portion provided to the movable portion, the end effector device being configured such that the peripheral portions of the plurality of substrates are held by the plurality of receiving portions of the first holding portion and the second holding portion when the movable portion advances, and the peripheral portions of the plurality of substrates are released from the receiving portions of the second holding portion when the movable portion retreats.

10. An end effector device comprising:

a hand;

a plurality of holding portions that are provided to the hand, and that hold a plurality of substrates such that each substrate of the plurality of substrates is arranged: (1) substantially parallel to one plane and (2) at intervals in a first direction, the first direction being substantially orthogonal to the one plane;

a single detector that is arranged outside the plurality of substrates viewed from the first direction, and that is configured to be able to detect a presence of each one of the substrates, opposing a peripheral portion of the substrate; and a detector moving mechanism that moves the single detector relative to the plurality of substrates in the first direction such that the single detector opposes the peripheral portion of every substrate, wherein each of the holding portions includes:
  a plurality of receiving portions that receive a peripheral portion of each substrate in substantially parallel to the one plane, and that are arranged in the first direction corresponding to number of the substrates; and
  a pitch conversion mechanism configured to move each receiving portion in the first direction so as to convert an interval between adjacent substrates, the pitch conversion mechanism and the detector moving mechanism are driven by separate drive sources, the detector moving mechanism moving the detector in the first direction so as to detect presence of the plurality of substrates in a state that the interval between adjacent substrates is set to a minimum interval by the pitch conversion mechanism, the pitch conversion mechanism includes:
  a plurality of linearly moving bodies each moving in the first direction and comprising a corresponding number of receiving portions to the number of the substrates; and
  a slider connected to the drive source and linearly moving in a second direction that is substantially parallel to the one plane so as to move the plurality of linearly moving bodies in the first direction, and wherein the detector moving mechanism is driven interlockingly with a linear movement of the slider.

* * * * *